(12) United States Patent
Kuraguchi

(10) Patent No.: US 7,449,730 B2
(45) Date of Patent: Nov. 11, 2008

(54) NITRIDE-BASED SEMICONDUCTOR DEVICE

(75) Inventor: Masahiko Kuraguchi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/564,571

(22) Filed: Nov. 29, 2006

(65) Prior Publication Data

US 2007/0145390 A1    Jun. 28, 2007

(30) Foreign Application Priority Data

Dec. 28, 2005    (JP)    ............... 2005-380321

(51) Int. Cl.
  *H01L 29/06*    (2006.01)
(52) U.S. Cl. .............. 257/199; 257/E31.084; 257/E29.327; 257/E21.053; 257/E21.352
(58) Field of Classification Search .............. 257/184, 257/E31.084, E29.195, E29.252, E29.327, 257/E21.053, E21.352, E33.025, E33.028, 257/E33.033, E33.034, E33.03, 194, 199, 257/E29.334, E29.337, E29.338
See application file for complete search history.

(56) References Cited

U.S. PATENT DOCUMENTS 6,982,204 B2    1/2006    Saxler et al.

2006/0108659 A1 *    5/2006    Yanagihara et al. ......... 257/471

FOREIGN PATENT DOCUMENTS

JP    2003-229566    8/2003
JP    2004-31896    1/2004

OTHER PUBLICATIONS

U.S. Appl. No. 11/506,776, filed Aug. 21, 2006, Masahiko Kuraguchi.
J. P. Ibbetson, et al., "Polarization effects, surface states, and the source of electrons in AlGaN/GaN heterostructure field effect transistors", Applied Physics Letters, vol. 77, No. 2, Jul. 10, 2000, pp. 250-252.

* cited by examiner

*Primary Examiner*—Matthew C. Landau
*Assistant Examiner*—Jay C Kim
(74) *Attorney, Agent, or Firm*—Oblon, Spivak, McClelland, Maier & Neustadt, P.C.

(57) ABSTRACT

A nitride-based semiconductor device includes a diode provided on a semiconductor substrate. The diode contains a first nitride-based semiconductor layer made of non-doped $Al_XGa_{1-X}N$ ($0 \leq X < 1$); a second nitride-based semiconductor layer made of non-doped or n-type $Al_YGa_{1-Y}N$ ($0 < Y \leq 1$, $X < Y$) having a lattice constant smaller than that of the first nitride-based semiconductor layer; a first electrode formed on the second nitride-based semiconductor layer; a second electrode formed on the second nitride-based semiconductor layer; and an insulating film that covers the second nitride-based semiconductor layer below a peripheral portion of the first electrode. In the diode, a recess structure portion is formed at a position near the peripheral portion of the first electrode on the second nitride-based semiconductor layer, and the first electrode covers the second nitride-based semiconductor layer and at least a part of the insulating film.

5 Claims, 15 Drawing Sheets

NITRIDE-BASED SEMICONDUCTOR DEVICE

CROSS-REFERENCE TO RELATED APPLICATIONS

This application is based upon and claims the benefit of priority from the prior Japanese Patent Application No. 2005-380321, filed on Dec. 28, 2005; the entire contents of which are incorporated herein by reference.

BACKGROUND OF THE INVENTION

1. Field of the Invention

The present invention generally relates to a nitride-based semiconductor device with a diode structure and a nitride-based semiconductor device with a diode and a field effect transistor provided on a same substrate.

2. Description of the Related Art

A power semiconductor device such as a switching device and a diode is used for a power conversion device such as a switching power supply. A high breakdown voltage, a low on-voltage, and a low reverse-bias leak current are demanded for the power semiconductor device. To obtain the high breakdown voltage, it is effective to use a material having high critical electric field. From these facts, a nitride-based semiconductor device made of a nitride-based semiconductor material is useful as a semiconductor device which is used in the power conversion device.

As a conventional nitride-based semiconductor device, a field effect transistor structured in the following manner has been known. The field effect transistor is such that a carrier traveling layer made of $Al_XGa_{1-X}N$ ($0 \leq X < 1$) film and a barrier layer made of $Al_YGa_{1-Y}N$ ($0 < Y \leq 1$, $X < Y$) film are successively laminated, and that a gate electrode is formed at a predetermined position on the surface of the barrier layer having a uniform thickness, and a source electrode and a drain electrode are formed at positions nearly symmetric across the gate electrode.

The AlN film has a lattice constant smaller than that of the GaN film. Therefore, when the Al composition ratio in the barrier layer is greater than the Al composition ratio in the carrier traveling layer, the lattice constant of the barrier layer becomes smaller as compared with that of the carrier traveling layer, and a distortion occurs in the barrier layer. In the nitride-based semiconductor, piezoelectric charge is produced in the barrier layer due to the piezo effect caused by the distortion in the barrier layer. The piezoelectric charge produced at that time causes a two-dimensional electron gas to be formed at the interface between the carrier traveling layer and the barrier layer.

For example, when the GaN film having the Al composition of X=0 is used as the carrier traveling layer and the $Al_YGa_{1-Y}N$ film is used as the barrier layer, a carrier density $n_s$ of the two-dimensional electron system to a film thickness $d_1$ of the barrier layer is obtained from the following equation (1) (J. P. Ibbetson et al., "Polarization effects, surface states, and the source of electrons in AlGaN/GaN heterostructure field effect transistors", Applied Physics Letters, Jul. 10, 2000, Vol. 77, No. 2, P. 250-252).

$$n_s = \sigma_{PZ} \times (1 - T_c/d_1) [\text{cm}^{-2}] \quad (1)$$

Where $\sigma_{PZ}$ is a charge density of piezoelectric charge produced in the barrier layer, and $d_1$ is a thickness of the barrier layer below the gate electrode. Further, Tc is a critical thickness of the barrier layer in which the carrier is generated. The critical thickness Tc is given by the following equation (2), and shows a dependency to the Al composition.

$$T_c = 16.4 \times (1 - 1.27 \times Y)/Y [\text{Å}] \quad (2)$$

As a device made of the nitride-based semiconductor material, a diode as follows can be considered. The diode is such that the carrier traveling layer made of a GaN film in which Al composition is X=0 and the barrier layer made of $Al_YGa_{1-Y}N$ ($0 \leq Y \leq 1$) film are successively laminated, and that an anode electrode having a Schottky contact and a cathode electrode having an ohmic contact which is arranged so as to surround the anode electrode are formed on the barrier layer with a predetermined thickness.

When the anode electrode with the Schottky contact is produced using metal such as Ni or Pt on the barrier layer, a Schottky barrier height is about 1 electron volt (eV). And then, a forward bias is applied to the anode electrode, and the nitride-based semiconductor device structured as above is caused to perform diode operation. An on-state voltage upon the diode operation becomes high such as about 1 volt (V), which is almost as high as the Schottky barrier height.

To lower the on-state voltage, the Schottky barrier height needs to be decreased. To decrease the Schottky barrier height, a method of replacing the material of the anode electrode with a metal having a low work function can be considered, but in this case, a reverse-bias leak current is increased. According to a calculation allowing for specific thermal emission, if the on-voltage is lowered by 0.1 V, the reverse-bias leak current increases by one digit or more. In other words, it is difficult for the nitride-based semiconductor device, which includes the anode electrode having the Schottky contact and the cathode electrode having the ohmic contact, to lower the on-voltage while keeping the reverse-bias leak current to be low.

SUMMARY OF THE INVENTION

According to one aspect of the present invention, a nitride-based semiconductor device comprising: a diode provided on a semiconductor substrate, the diode including a first nitride-based semiconductor layer made of non-doped $Al_XGa_{1-X}N$ ($0 \leq X < 1$); a second nitride-based semiconductor layer formed on the first nitride-based semiconductor layer and made of non-doped or n-type $Al_YGa_{1-Y}N$ ($0 < Y \leq 1$, $X < Y$) having a lattice constant smaller than that of the first nitride-based semiconductor layer; a first electrode formed on the second nitride-based semiconductor layer; a second electrode formed on the second nitride-based semiconductor layer spaced from the first electrode so as to surround the first electrode; and an insulating film that covers the second nitride-based semiconductor layer below a peripheral portion of the first electrode, wherein a recess structure portion is formed by removing a part of the second nitride-based semiconductor layer at a position near the peripheral portion of the first electrode on the second nitride-based semiconductor layer, and the first electrode is formed so as to cover the second nitride-based semiconductor layer surrounded by the recess structure portion and at least a part of the insulating film formed on the recess structure portion.

According to another aspect of the present invention, a nitride-based semiconductor device comprising: a diode provided on a semiconductor substrate, the diode including a first nitride-based semiconductor layer made of non-doped $Al_XGa_{1-X}N$ ($0 \leq X < 1$); a second nitride-based semiconductor layer formed on the first nitride-based semiconductor layer and made of non-doped or n-type $Al_YGa_{1-Y}N$ ($0 < Y \leq 1$, $X < Y$) having a lattice constant smaller than that of the first nitride-based semiconductor layer; a first semiconductor layer formed on the second nitride-based semiconductor layer and made of a semiconductor having a lattice constant equal to that of the first nitride-based semiconductor layer; a second semiconductor layer formed on the first semiconductor layer and made of a non-doped or n-type semiconductor having a lattice constant smaller than that of the first nitride-based semiconductor layer; a first electrode formed on the second semiconductor layers; a second electrode formed spaced from the first electrode so as to surround the first electrode, and formed on any one of the second nitride-based semiconductor layer, the first semiconductor layer, and the second semiconductor layer; and an insulating film that covers the first semiconductor layer below a peripheral portion of the first electrode, wherein a recess structure portion is formed at a position near the peripheral portion of the first electrode on the second semiconductor layer, a bottom of the recess structure portion being reached to the first semiconductor layer, and the first electrode is formed so as to cover the first and second semiconductor layers which are surrounded by the recess structure portion, and at least a part of the insulating film formed on the recess structure portion.

DETAILED DESCRIPTION OF THE INVENTION

Exemplary embodiments of the present invention are explained in detail below with reference to the accompanying drawings. It is noted that the present invention is not limited by these embodiments. Further, the cross sections of the nitride-based semiconductor devices used in the embodiments are schematic, and therefore, a relation between the thickness and the width of each layer or a ratio between the thicknesses of the layers is different from its real one.

Figure 1A:
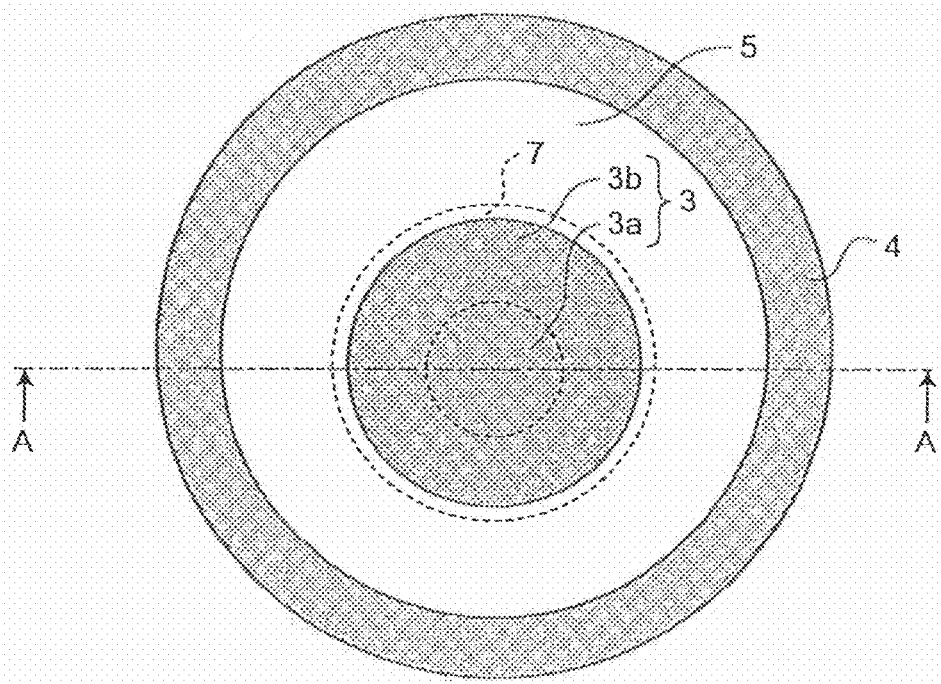
FIG. 1A is a schematic plan view of a nitride-based semiconductor device according to a first embodiment.
Figure 1B:
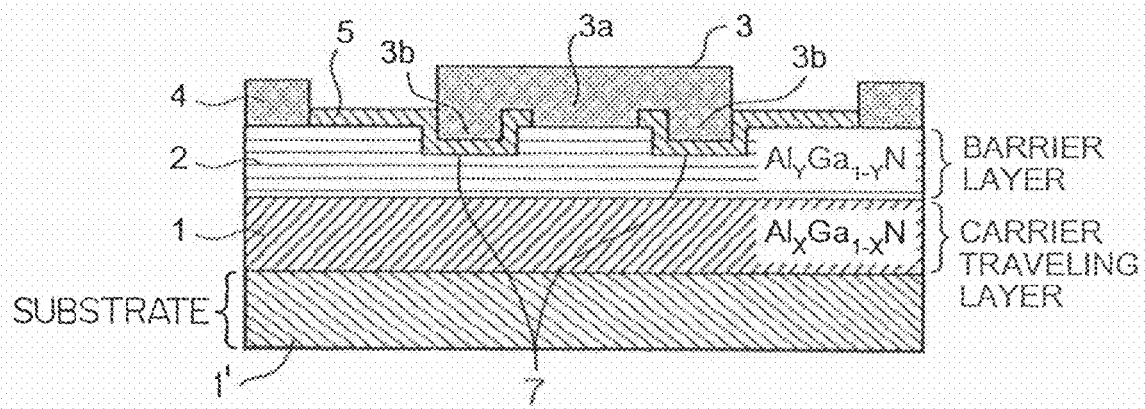
FIG. 1B is a cross-sectional view taken along the line A-A of FIG. 1A.

FIG. 1A is a schematic plan view of a nitride-based semiconductor device according to a first embodiment, and FIG. 1B is a cross-section taken along the line A-A of FIG. 1A. The nitride-based semiconductor device is obtained by successively laminating a carrier traveling layer 1 and a barrier layer 2 on a substrate 1', and forming an anode electrode 3 on the barrier layer 2 and also a cathode electrode 4 thereon so as to surround the anode electrode 3. Specifically, the carrier traveling layer 1 is made of $Al_xGa_{1-x}N$ ($0 \leq X < 1$) which is a non-doped nitride-based semiconductor, and the barrier layer 2 is made of $Al_YGa_{1-Y}N$ ($0 < Y \leq 1, X < Y$) which is a non-doped or n-type nitride-based semiconductor having a lattice constant smaller than that of the carrier traveling layer 1.

The example of FIG. 1A shows that the planar shape of the anode electrode 3 is a circle, and that the planar shape of the cathode electrode 4 is a circular ring shape formed at a position apart from a peripheral portion 3b of the anode electrode 3 by a predetermined distance so as to surround the anode electrode 3. However, any shape may be used if the cathode electrode 4 surrounds the anode electrode 3. It is noted that the carrier traveling layer 1 corresponds to a first nitride-based semiconductor layer, and similarly, the barrier layer 2 corresponds to a second nitride-based semiconductor layer, the anode electrode 3 corresponds to a first electrode, and the cathode electrode 4 corresponds to a second electrode, in the appended claims.

A recess structure 7 is formed by removing a part of the barrier layer 2 at the position on the barrier layer 2 corresponding to the peripheral portion 3b which is more outward than a central portion 3a of the anode electrode 3. An insulating film 5 is formed between the circumference of a region surrounded by the recess structure 7 in the barrier layer 2 and the position where the cathode electrode 4 is formed. However, all the region surrounded by the recess structure 7 in the barrier layer 2 is not covered with the insulating film 5. With this feature, the anode electrode 3 is directly formed on the barrier layer 2 in its central portion 3a, but is formed on the barrier layer 2, through the insulating film 5, in its peripheral portion 3b which is more outward than the central portion 3a. In other words, the thickness of the barrier layer 2 at the peripheral portion 3b formed in the recess structure 7 is smaller than that at the central portion 3a of the anode electrode 3. It is desirable to use a material, which enables ohmic contact with a nitride-based semiconductor material, for the anode electrode 3 and the cathode electrode 4, and it is also desirably to use the same material as each other. As the material above, Ti, Al, Mo, and the like can be exemplified. It is noted that the recess structure 7 corresponds to a recess structure portion, in the appended claims.

Figure 2:
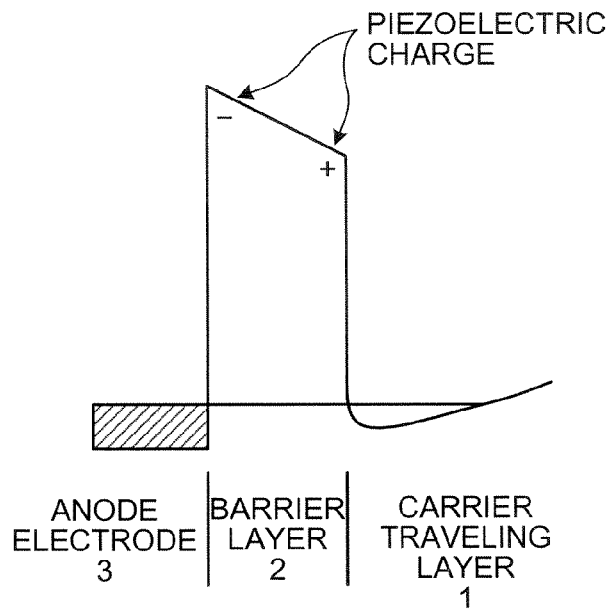
FIG. 2 is a schematic view of an energy state of a conduction band at the central portion of an anode electrode in FIG. 1A and FIG. 1B.
Figure 3:
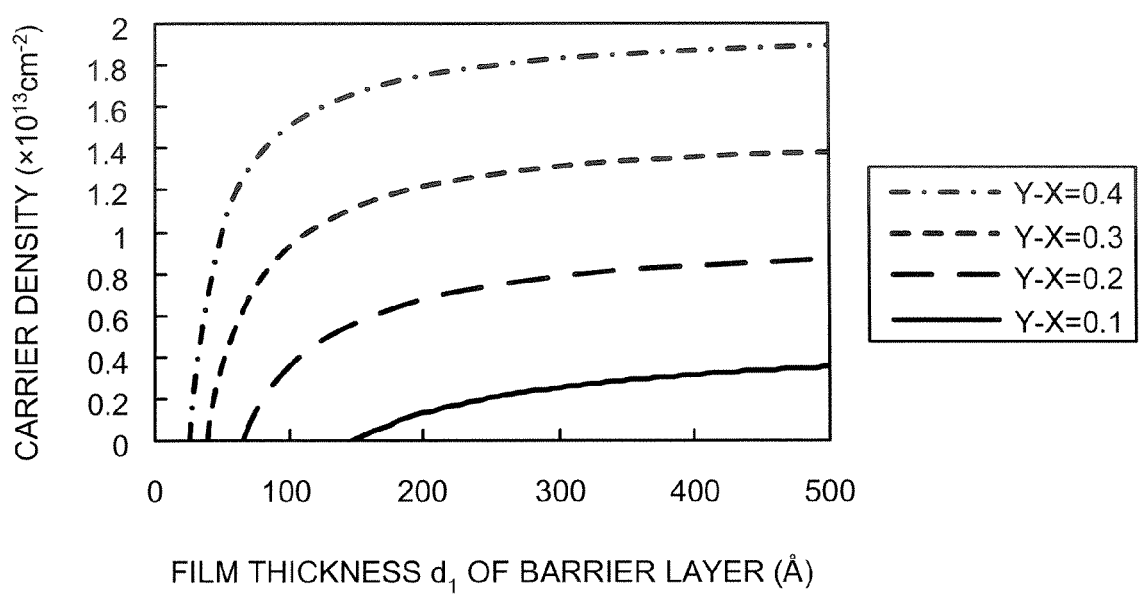
FIG. 3 is a graph of a relationship between the thickness of the barrier layer and the carrier density in the nitride-based semiconductor device.

In the nitride-based semiconductor device shown in FIG. 1A and FIG. 1B, the diode operations when a negative voltage is applied to the anode electrode 3 and when a positive voltage is applied to the anode electrode 3 are explained below. The state of electrons at the interface between the carrier traveling layer 1 and the barrier layer 2 of the nitride-based semiconductor device according to the first embodiment is explained first. FIG. 2 is a schematic view of an energy state of a conduction band at the central portion of the anode electrode in FIG. 1A and FIG. 1B. FIG. 3 is a graph of a relationship between the thickness of the barrier layer and the carrier density in the nitride-based semiconductor device.

As explained in the Related Art, when the barrier layer 2 made of $Al_YGa_{1-Y}N$ ($0<Y\leq1$, X<Y) film having the lattice constant smaller than that of the carrier traveling layer 1 is epitaxially deposited on the carrier traveling layer 1 made of $Al_XGa_{1-X}N$ ($0\leq X<1$) film, the lattice constant of the $Al_YGa_{1-Y}N$ ($0\leq X<1$) forming the barrier layer 2 becomes larger than its normal value, which leads to occurrence of distortion. Piezoelectric charge is produced in the barrier layer 2 due to the piezo effect caused by the distortion in the barrier layer 2, and a two-dimensional electron gas is formed at the interface between the carrier traveling layer 1 and the barrier layer 2 due to the piezoelectric charge produced. As also explained in the Related Art, the carrier density of the two-dimensional electron gas can be controlled by the film thickness $d_1$ of the barrier layer 2. In other words, the piezoelectric charge depends on the film thickness $d_1$ of the barrier layer 2, and, as shown in FIG. 3, the carrier density increases as the film thickness $d_1$ of the barrier layer 2 is increased. Therefore, the recess structure 7 in the barrier layer 2 formed at a portion corresponding to the peripheral portion 3b of the anode electrode 3 causes the thickness $d_1$ of the barrier layer 2 at the portion to be reduced as compared with that of the other portions. The carrier density of the two-dimensional electron system below the recess structure 7 thereby becomes low.

Figure 4:
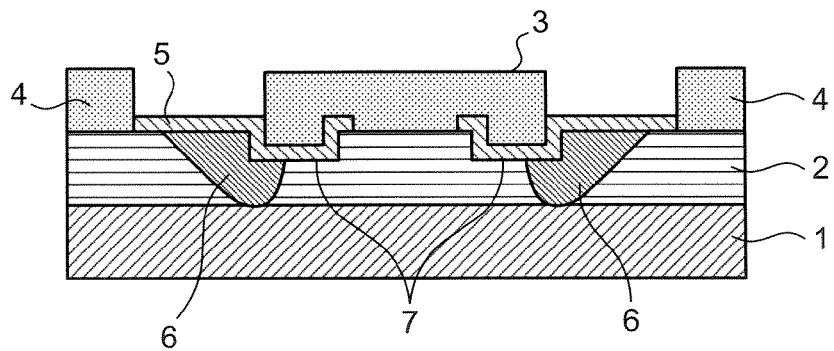
FIG. 4 is a schematic view of a case where reverse bias is applied to the anode electrode of the nitride-based semiconductor device in FIG. 1B.

FIG. 4 is a schematic view of a case where reverse bias is applied to the anode electrode of the nitride-based semiconductor device of FIG. 1B. When the anode electrode 3 is applied with a negative voltage to be in reverse bias, the peripheral portion 3b of the anode electrode 3 formed in the recess structure 7 serves as a role similar to a gate electrode of a field effect transistor 12, and a depletion layer 6 is formed near the position in the barrier layer 2 corresponding to the peripheral portion 3b of the anode electrode 3, through the insulating film 5. Because the depletion layer 6 develops in a portion where the carrier density is low, it develops near the recess structure 7 where the thickness of the barrier layer 2 is thin. The depletion layer 6 electrically insulates the anode electrode 3 from the cathode electrode 4, thus the nitride-based semiconductor device shown in FIG. 4 is turned to the off-state. The electric field is concentrated near the end of the recess structure 7 on its cathode electrode 4 side.

When the anode electrode 3 is applied with a positive voltage to be in forward bias, the forward bias is also applied to the two-dimensional electron system below the recess structure 7 of the barrier layer 2. This causes the carrier density of the two-dimensional electron system below the recess structure 7 to increase and the resistance in this region to decrease, and the nitride-based semiconductor device shown in FIGS. 1A and 1B is turned to the on-state.

Figure 5:
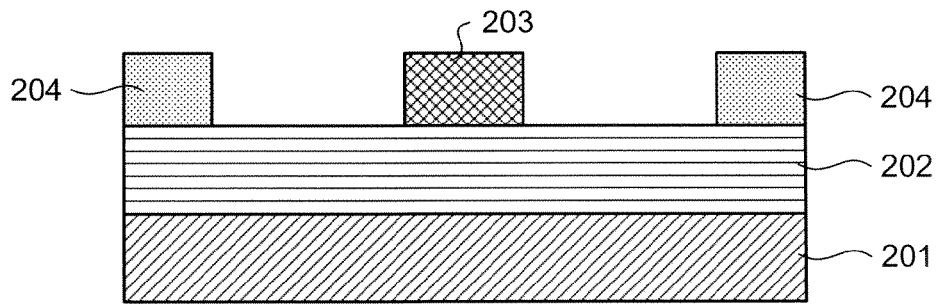
FIG. 5 is a schematic view of the cross-sectional structure of a conventional nitride-based semiconductor device using a Schottky contact.

FIG. 5 is a schematic view of the cross-sectional structure of the conventional nitride-based semiconductor device using a Schottky contact. The conventional nitride-based semiconductor device is obtained by successively laminating a carrier traveling layer 201 made of $Al_XGa_{1-X}N$ ($0\leq X<1$) which is a non-doped nitride-based semiconductor, and a barrier layer 202 made of $Al_YGa_{1-Y}N$ ($0<Y\leq1$, X<Y) which is a non-doped or n-type nitride-based semiconductor having a lattice constant smaller than that of the carrier traveling layer 201, on a substrate (not shown), and by forming an anode electrode 203 having a Schottky contact and a cathode electrode 204 having an ohmic contact arranged so as to surround the anode electrode 203, on the barrier layer 202. In the conventional example of FIG. 5, the thickness of the barrier layer 202 below the anode electrode 203 and the thickness thereof below the cathode electrode 204 are the same as each other.

In the conventional nitride-based semiconductor device, when the reverse bias is applied to the anode electrode 203 having the Schottky contact, the electric field is concentrated on the edge of the anode electrode 203, and a reverse-bias leak current thereby increases. Therefore, it is difficult to reduce the reverse-bias leak current. Further, when the forward bias is applied to the anode electrode 203 having the Schottky contact, because the anode electrode 203 is Schottky-contacted with the nitride-based semiconductor (barrier layer 202), it is difficult to reduce the on-state voltage to a value not more than the Schottky barrier height.

In the first embodiment, on the other hand, when the reverse bias is applied to the anode electrode 3, because the insulating film 5 is formed below the peripheral portion 3b (recess structure 7) of the anode electrode 3 where the electric field is concentrated, the depletion layer 6 is formed around the recess structure 7 as shown in FIG. 4, to enable minimization of the reverse-bias leak current from flowing on the barrier layer 2. Furthermore, when the forward bias is applied to the anode electrode 3, the anode electrode 3 and the cathode electrode 4 can be in ohmic contact with the two-dimensional electron system, thus realizing a low on-state voltage.

In the first embodiment, to suppress the reverse-bias leak current to be low, it is desirable that the two-dimensional electron system below the recess structure 7 be depleted when the potential of the anode electrode 3 is equal to that of the cathode electrode 4. With this feature, by applying a slight amount of negative bias to the anode electrode 3, the depletion layer 6 extends from the end of the recess structure 7 on its cathode electrode 4 side to the side of the cathode electrode 4, thus suppressing the reverse-bias leak current.

The condition for not producing the two-dimensional electron system below the peripheral portion 3b of the anode electrode 3 or for depleting the two-dimensional electron system below the recess structure 7 in the nitride-based semiconductor device according to the first embodiment is explained below. In the nitride-based semiconductor device shown in FIG. 1B, the critical thickness Tc of the barrier layer 2 in which the carrier is generated below the peripheral portion 3b of the anode electrode 3 is represented by the following equation (3).

$$T_c=16.4\times(1-1.27\times(Y-X))/(Y-X) [\text{Å}] \qquad (3)$$

Figure 6:
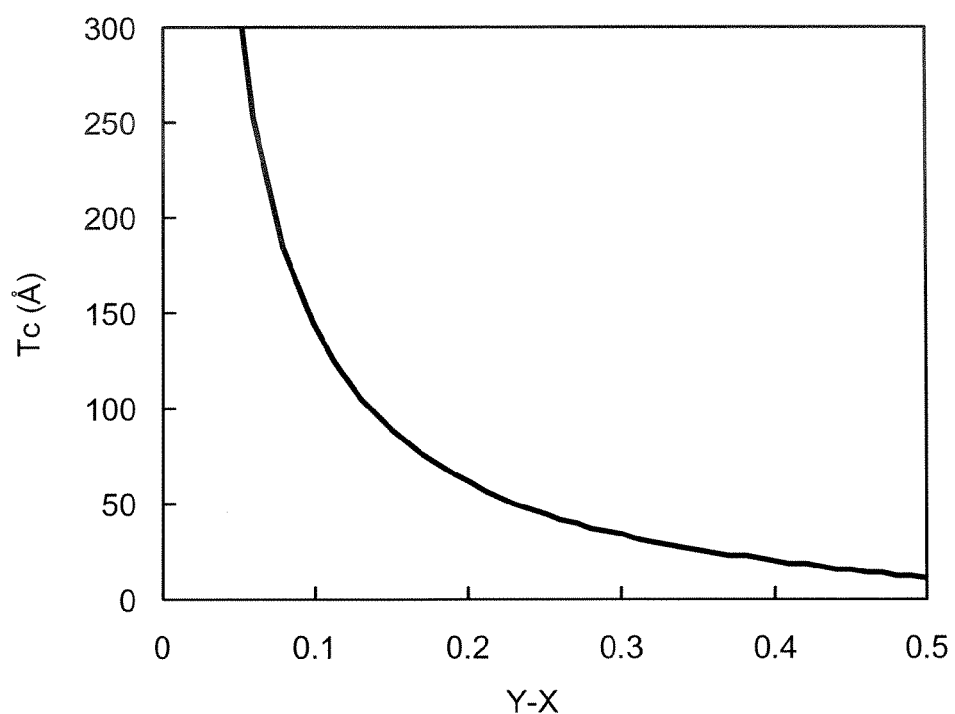
FIG. 6 is a graph of a relationship between a critical thickness and a difference in a composition ratio between a carrier traveling layer and the barrier layer.

In the equation (3), Y is the Al composition of the barrier layer 2, X is the Al composition of the carrier traveling layer 1. The reason why the critical thickness Tc becomes the function of Y−X in the equation (3) is because the difference in the lattice constant between the carrier traveling layer 1 and the barrier layer 2 can be represented as the difference in the composition ratio between the two. FIG. 6 is a graph of a relationship between a critical thickness and a difference in a composition ratio between the carrier traveling layer and the barrier layer. FIG. 6 shows the equation (3) in the form of a graph representing a state in which the critical thickness Tc depends upon the Al composition. From this relationship, by reducing the thickness of the barrier layer 2 at the position where the recess structure 7 is formed, to a value not more than the critical thickness Tc, the carrier density of the two-dimensional electron system formed below the peripheral portion 3b of the anode electrode 3 can be made zero. In this case, however, the condition of Y−X<1/1.27 (=0.787) should be satisfied, considering the condition in which the critical thickness Tc has to be positive in the equation (3). Therefore, the thickness of the barrier layer 2 below the recess structure 7 is desirably set to a value not more than the critical thickness Tc represented by the equation (3).

Figure 7A:
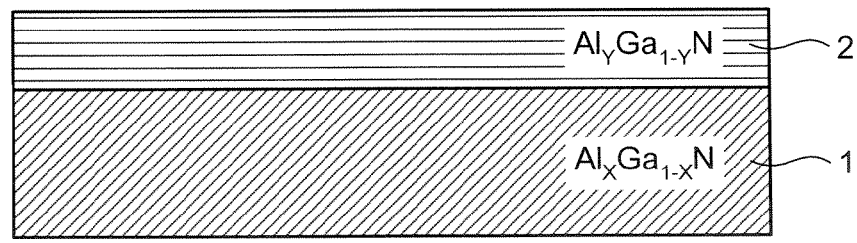
FIG. 7A to FIG. 7G are schematic cross-sectional views of one example of a procedure for a method of manufacturing the nitride-based semiconductor device according to the first embodiment.

The method of manufacturing the nitride-based semiconductor device shown in FIG. 1A and FIG. 1B is explained below. FIG. 7A to FIG. 7G are schematic cross-sectional views of one example of a procedure for the method of manufacturing the nitride-based semiconductor device according to the first embodiment. At first, as shown in FIG. 7A, the carrier traveling layer 1 made of a non-doped $Al_XGa_{1-X}N$ ($0 \leq X < 1$) film of about 2 micrometers (μm) and the barrier layer 2 made of a non-doped or n-type $Al_YGa_{1-Y}N$ ($0 < Y \leq 1$, $X<Y$) film of about 20 nanometers (nm) are successively grown on a substrate (not shown) on which a predetermined film is formed as required. The carrier traveling layer 1 and the barrier layer 2 are formed by using epitaxial crystal growth technique such as Metal Organic Chemical Vapor Deposition (MOCVD) that can control a film thickness at a level of atomic layer.

Because the Al composition Y of the barrier layer 2 is larger than the Al composition X of the carrier traveling layer 1 (X<Y), the lattice constant of the barrier layer 2 becomes smaller than that of the carrier traveling layer 1. The barrier layer 2 is epitaxially grown on the carrier traveling layer 1, but the film thickness of the barrier layer 2 is thinner than the film thickness in which dislocation occurs. Therefore, the crystal of the semiconductor film that forms the barrier layer 2 is grown according to the crystal structure of the lower layer, extended in the direction parallel to the growth surface, and has a distortion.

Figure 7B:
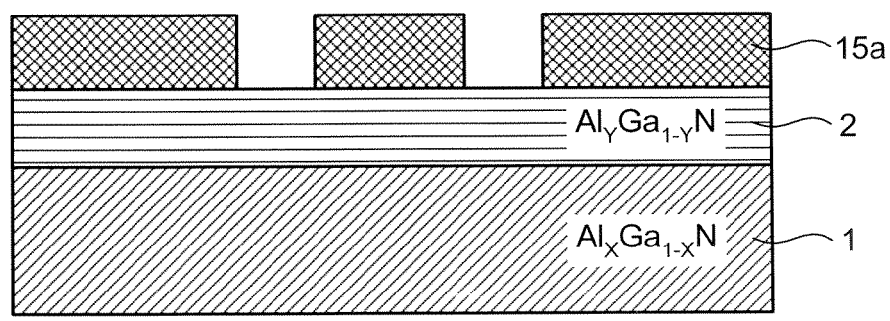

As shown in FIG. 7B, a photoresist film 15a is applied to the barrier layer 2, and the photoresist film 15a is exposed and developed by a photolithography technique to form an etching mask obtained by removing the photoresist film 15a at the position where the recess structure 7 is formed. This etching mask is the one such that the portion corresponding to the peripheral portion 3b of the anode electrode 3 is removed as a circular ring shape when the etching mask has the structure of the anode electrode 3 shown in FIG. 1A, for example.

Figure 7C:
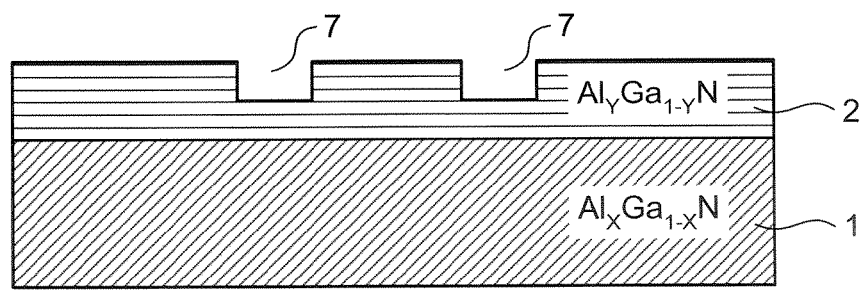

As shown in FIG. 7C, by using the etching mask, the barrier layer 2 is selectively removed to a predetermined depth by an etching technique such as a reactive ion etching (RIE) method, to form the recess structure 7. Thereafter, the etching mask (photoresist film 15a) used is removed.

Figure 7D:
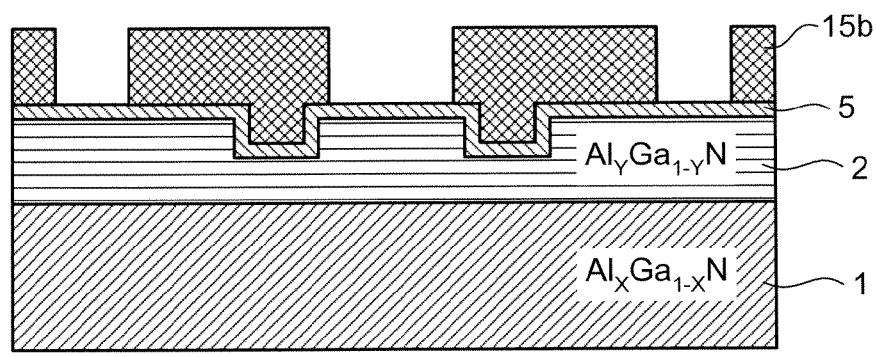

As shown in FIG. 7D, the insulating film 5 having a predetermined thickness is formed over the whole surface of the barrier layer 2 in which the recess structure 7 has been formed, and then, a photoresist film 15b is applied to the insulating film 5. Thereafter, the photoresist film 15b is exposed and developed by the photolithography technique, and is removed from the regions where the anode electrode 3 and the cathode electrode 4 are formed on the barrier layer 2 to form the etching mask. When the nitride-based semiconductor device has the structure as shown in FIG. 1A and FIG. 1B, the photoresist film 15b near the central portion 3a, of the anode electrode 3, which directly contacts the barrier layer 2 is removed.

Figure 7E:
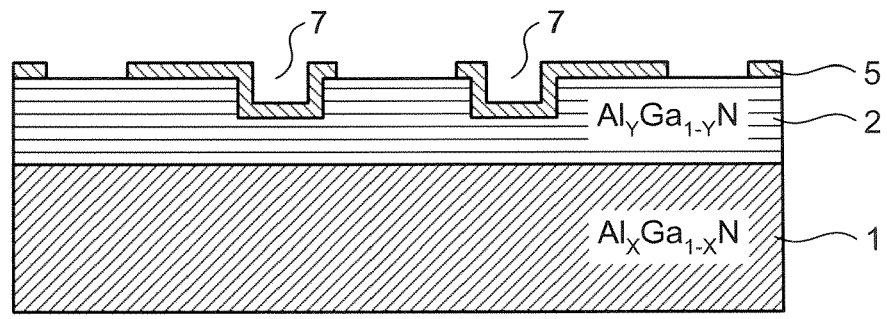
Figure 7F:
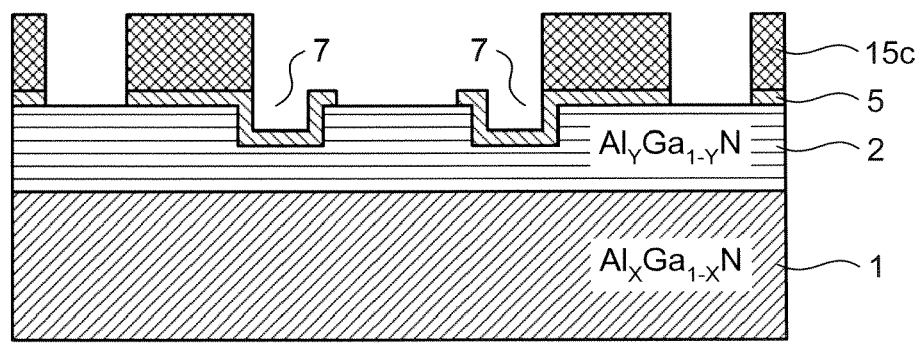

As shown in FIG. 7E, a part of the insulating film 5 is selectively removed by the technique such as the reactive ion etching method with the etching mask, and then, the etching mask (photoresist film 15b) is removed. Thereafter, as shown in FIG. 7F, a new photoresist film 15c is applied to the barrier layer 2 on a part of which the insulating film 5 is formed, and the photoresist film 15c in the respective regions where the anode electrode 3 and the cathode electrode 4 are formed is removed.

Figure 7G:
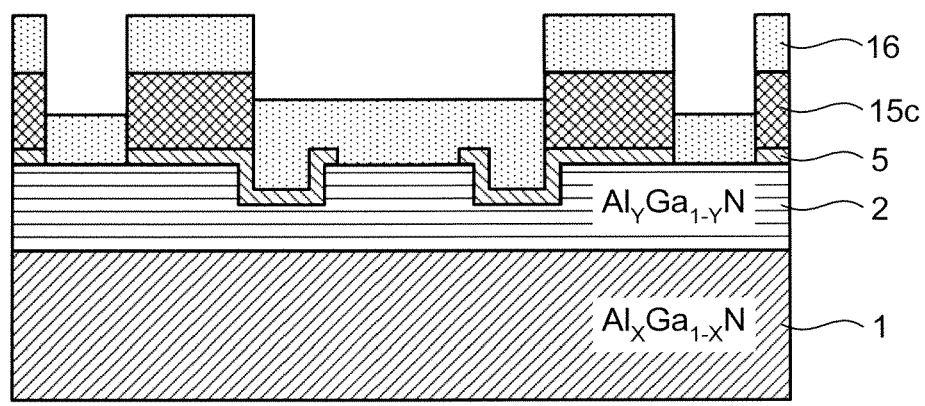

As shown in FIG. 7G, a conductive material film 16 for electrodes is deposited on the insulating film 5 where the photoresist film 15c is formed and on the barrier layer 2. Specifically, the conductive material film 16 is made of a conductive material such as metal and alloy of which the anode electrode 3 and the cathode electrode 4 are made. The photoresist film 15c and the conductive material film 16 at positions other than the positions, where the anode electrode 3 and the cathode electrode 4 are formed, are removed by using a lift-off method, to thereby form the anode electrode 3 and the cathode electrode 4, and the nitride-based semiconductor device shown in FIG. 1A and FIG. 1B is manufactured.

As explained above, in the first embodiment, there is no need to use a Schottky contact material for the anode electrode 3, but an ohmic contact material can be used instead. Therefore, the same electrode material can be used for both the anode electrode 3 and the cathode electrode 4. With this feature, the anode electrode 3 and the cathode electrode 4 can be simultaneously formed, and the number of manufacturing steps can thereby be reduced, which allows manufacture of the nitride-based semiconductor device with a diode structure in a simpler manner.

The nitride-based semiconductor device shown in FIG. 1A and FIG. 1B is only one example, and therefore, it may have another structure. FIG. 8 to FIG. 11 are schematic views of modifications of the nitride-based semiconductor device according to the first embodiment. In the following explanation, the same components are assigned with the same reference letters or numerals corresponding to those in FIG. 1A and FIG. 1B, and explanation thereof is omitted.

Figure 8:
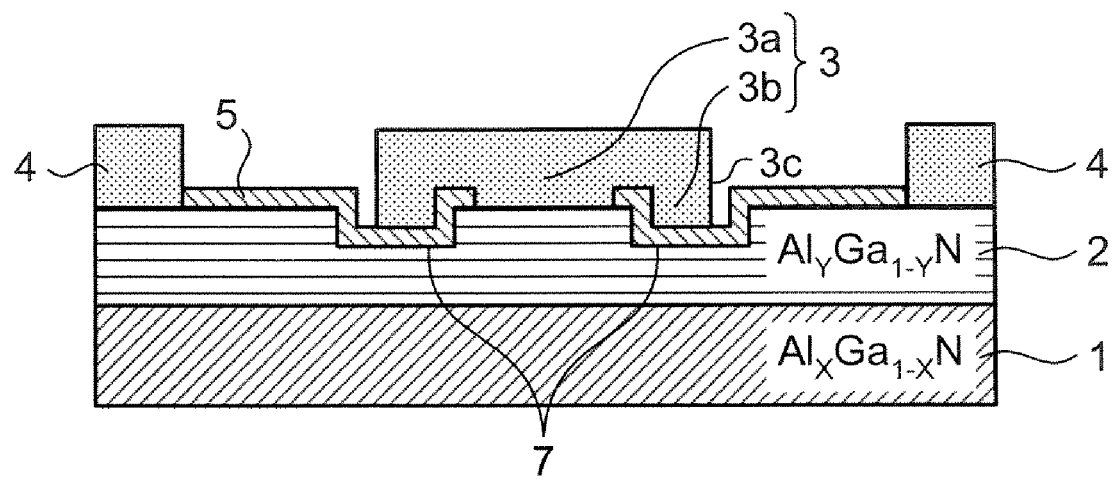
FIG. 8 is a schematic view of a modification of the nitride-based semiconductor device according to the first embodiment.
Figure 9:
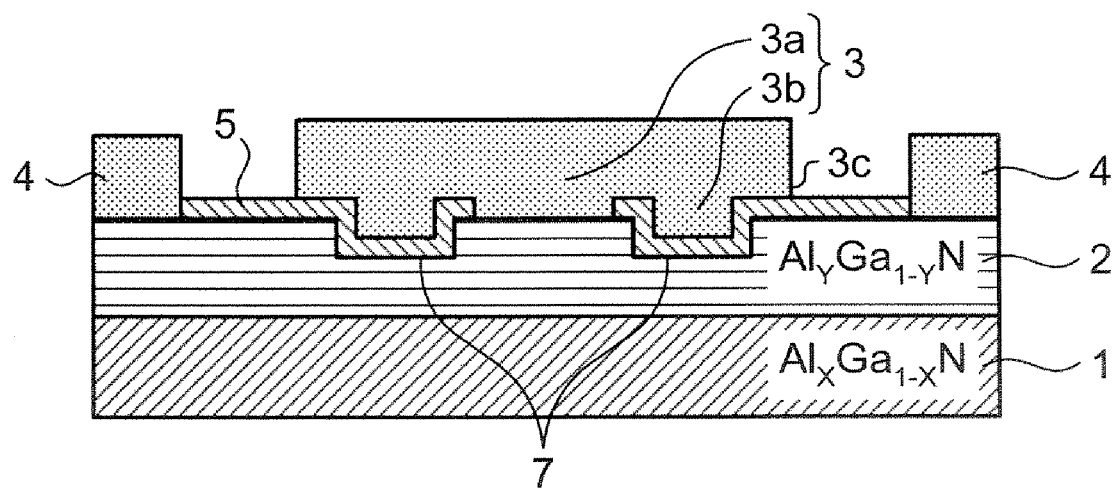
FIG. 9 is a schematic view of another modification of the nitride-based semiconductor device according to the first embodiment.

FIG. 8 and FIG. 9 are cross-sectional views of other examples of the nitride-based semiconductor device according to the first embodiment. The nitride-based semiconductor devices shown in FIG. 8 and FIG. 9 are the same as each other in a point that the recess structure 7 is formed at the position on the barrier layer 2 corresponding to the peripheral portion 3b of the anode electrode 3, similarly to FIG. 1B. In the case of FIG. 8, however, an edge 3c of the peripheral portion 3b of the anode electrode 3 is located in the recess structure 7, and it is different from FIG. 1B that the edge 3c is formed not on the whole area of the recess structure 7. In the case of FIG. 9, the edge 3c of the peripheral portion 3b is protruded from the recess structure 7 toward a side of the cathode electrode 4, and this is different from FIG. 1B. Even if the nitride-based semiconductor devices are structured as shown in FIG. 8 and FIG. 9, respectively, the diode operation becomes possible. Therefore, if the anode electrode 3 is formed in at least a part of the recess structure 7 in its width direction, the on-state or the off-state of the nitride-based semiconductor device can be controlled by applying the forward bias or the reverse bias to the anode electrode 3. In other words, if the peripheral portion 3b of the anode electrode 3 is positioned in the recess structure 7, the nitride-based semiconductor device capable of diode operation can be freely designed.

Figure 10:
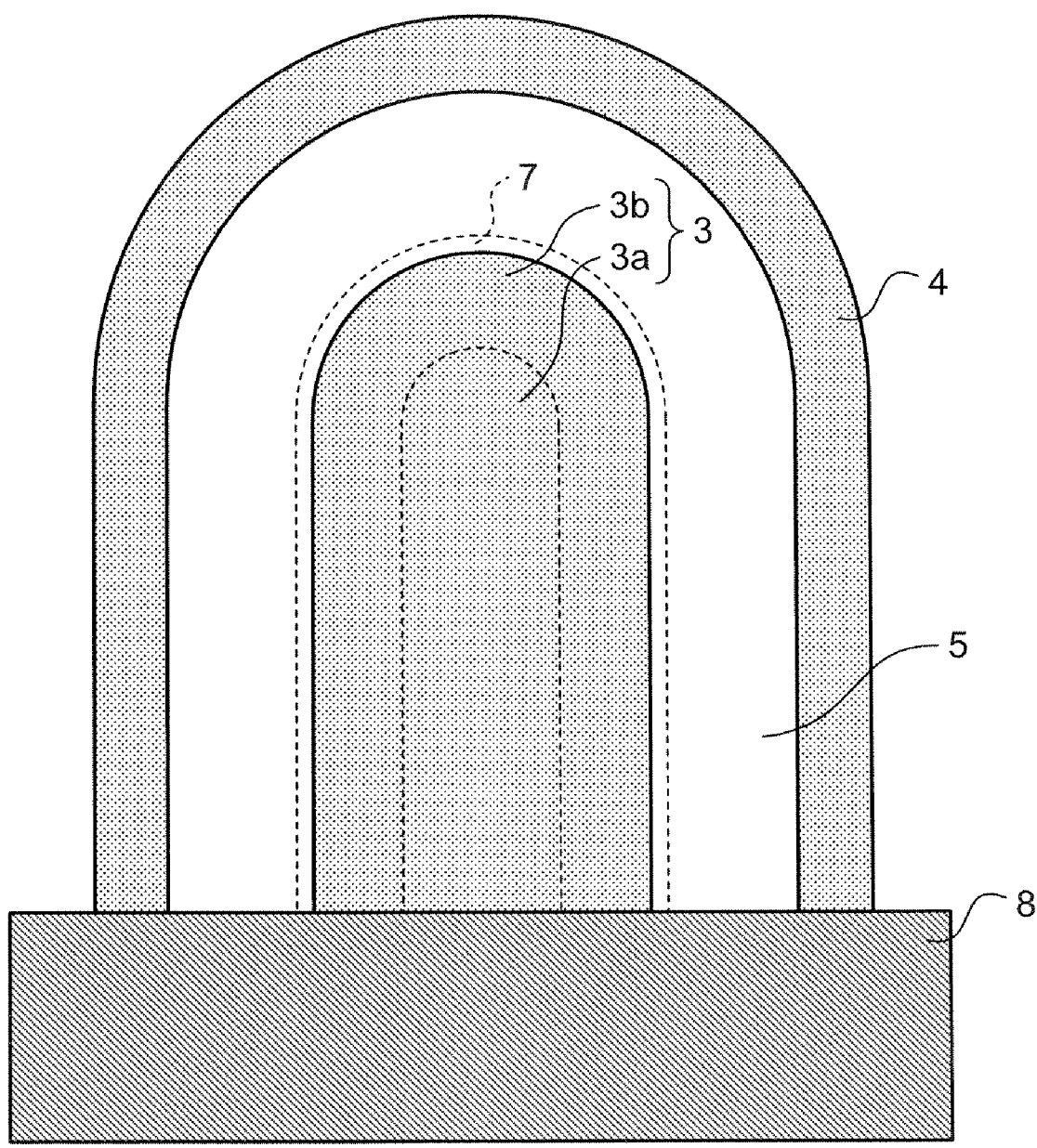
FIG. 10 is a schematic view of another modification of the nitride-based semiconductor device according to the first embodiment.

FIG. 10 is a plan view of another example of the nitride-based semiconductor device according to the first embodiment. In this nitride-based semiconductor device, the recess structure 7 does not fully surround the central portion 3a of the anode electrode 3, but an element separating region (device isolating region) 8 and the recess structure 7 surround the anode electrode 3, which is a different point from FIG. 1A. The element separating region 8 is formed to electrically separate the region where the diode is formed from another element forming region, and formed by ion-implantation of nitrogen ($N^+$), helium ($He^+$), or proton ($H^+$) to the substrate where the carrier traveling layer 1 and the barrier layer 2 are laminated, or by the substrate being subjected to mesa etching. Here, the element separating region 8 is formed in contact with the anode electrode 3, the cathode electrode 4, and even the insulating film 5. In the example of FIG. 10, the anode electrode 3 is formed so as to be in contact with one side of the element separating region 8 formed on the substrate.

The anode electrode 3 extends in the direction perpendicular to one side of the element separating region 8 in contact therewith, and the edge of the anode electrode 3 opposite to the edge in contact with the element separating region 8 is formed into a semicircular arc. The cathode electrode 4 having a reverse U-shape is formed, so as to surround the anode electrode 3, at the position apart from the edge of the anode electrode 3 by a predetermined distance so that both the edges of the cathode electrode 4 are in contact with the one side of the element separating region 8. The recess structure 7 having a substantially reverse U-shape is formed at a region of the barrier layer 2 corresponding to the peripheral portion 3b of the anode electrode 3 which does not contact the element separating region 8. The insulating film 5 is formed so as to cover the barrier layer 2 between the circumference of the barrier layer 2 surrounded by the recess structure 7 and the edge of the cathode electrode 4 on its anode electrode 3 side through the recess structure 7. In this case also, the central portion 3a of the anode electrode 3 directly contacts the barrier layer 2 and the peripheral portion 3b thereof contacts the insulating film 5 formed on the barrier layer 2 so that at least a part of the peripheral portion 3b is formed in a part of the recess structure 7 in its width direction.

Because a current does not flow by nature in the element separating region 8 where no two-dimensional electron system exists, there is no need to provide the recess structure 7 therein. Therefore, by surrounding the anode electrode 3 by the recess structure 7 and the element separating region 8, the effect of the nitride-based semiconductor device with the diode structure is obtained. Further, because no two-dimensional electron system exists in the element separating region 8, the electric field concentration hardly occurs. Therefore, by structuring the nitride-based semiconductor device as shown in FIG. 10, a stable breakdown voltage can be obtained.

Figure 11:
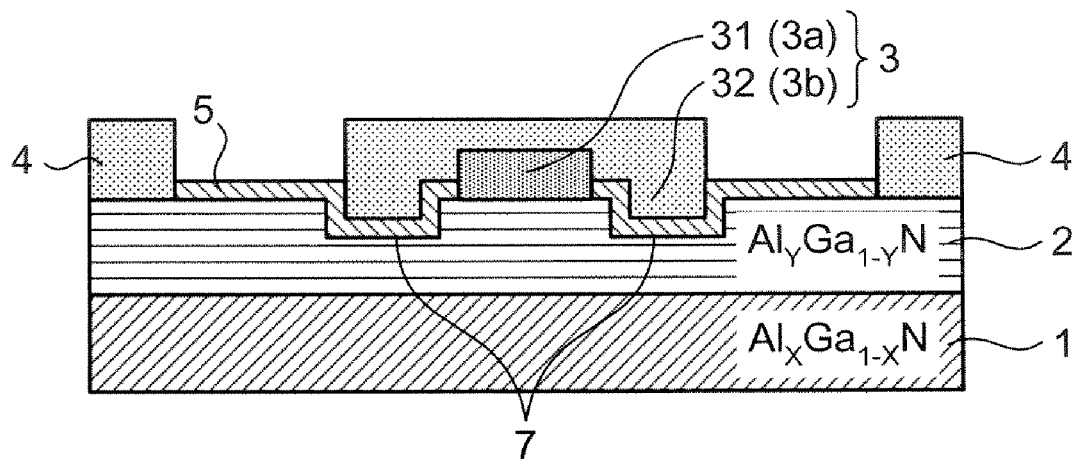
FIG. 11 is a schematic view of another example of the nitride-based semiconductor device according to the first embodiment.

FIG. 11 is a cross-sectional view of another example of the nitride-based semiconductor device according to the first embodiment. The nitride-based semiconductor device of FIG. 11 has the anode electrode 3 formed with two kinds of conductive materials, based on FIG. 1A and FIG. 1B. More specifically, the anode electrode 3 includes a first anode electrode 31 and a second anode electrode 32. The first anode electrode 31 is made of a conductive material such as a metal having low contact resistance (Ohmic contact) against the nitride-based semiconductor at the central portion 3a where the anode electrode 3 directly contacts the barrier layer 2. The second anode electrode 32 is made of a conductive material such as a metal having high adhesion to the insulating film 5 in the peripheral portion 3b formed on the insulating film 5 except the central portion 3a. In this manner, the metal (Ti, Al, Mo, etc.) having low contact resistance against the nitride-based semiconductor is used for the first anode electrode 31, while the metal (Ti or Ni) having high adhesion to the insulator is used for the second anode electrode 32, and it is thereby possible to manufacture the nitride-based semiconductor device having the diode structure with good yield while keeping low on-resistance. The conductive material forming the second anode electrode 32 may be any material if it has good adhesion to the insulating film 5.

According to the first embodiment, it is possible to provide the nitride-based semiconductor device capable of operating as a diode having a low on-state voltage and a low reverse-bias leak current.

Figure 12:
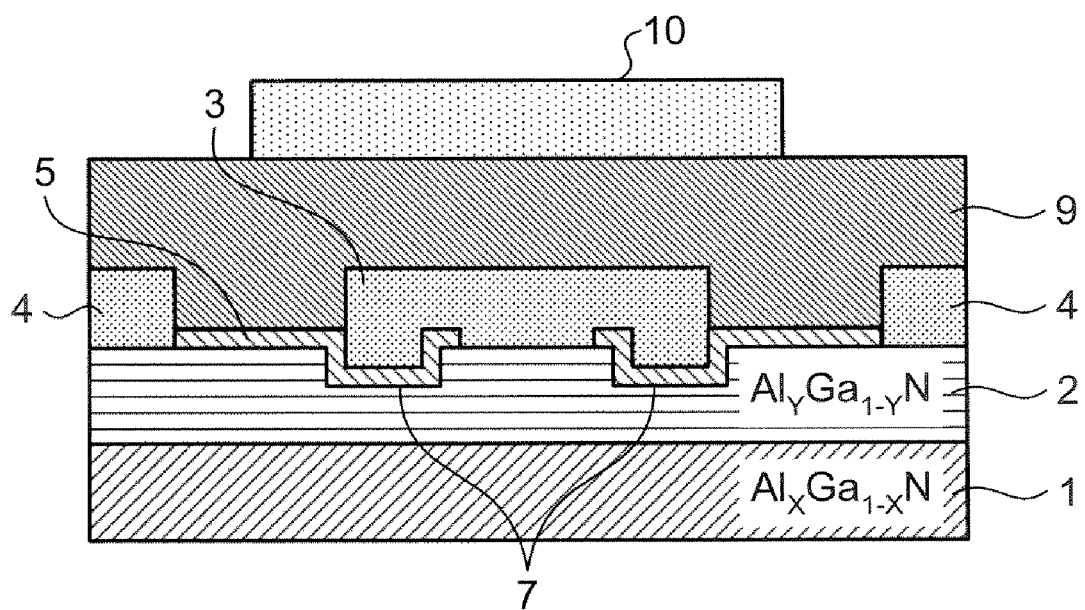
FIG. 12 is a schematic cross-sectional view of a nitride-based semiconductor device according to a second embodiment.

FIG. 12 is a schematic cross-sectional view of a nitride-based semiconductor device according to a second embodiment. The planar structure of the nitride-based semiconductor device is assumed, as shown in FIG. 10, that the anode electrode 3 is surrounded by the recess structure 7 and the element separating region 8. In the nitride-based semiconductor device shown in FIG. 12, an insulating film 9 is formed over the whole surface of the nitride-based semiconductor device having the cross-sectional structure shown in FIG. 1B, and a field plate electrode 10 is formed on the insulating film 9. The cross-section of the field plate electrode 10 is such that its edge is located in between the edge of the anode electrode 3 and the edge of the cathode electrode 4 on its anode electrode 3 side.

When the anode electrode 3 of the nitride-based semiconductor device is applied with reverse bias to be turned to the off-state, the electric field concentration occurring near the anode electrode 3 is relieved by the field plate electrode 10. This allows improvement of off-breakdown voltage. To relieve the electric field concentration, the field plate electrode 10 is desirably connected to the anode electrode 3 or to the cathode electrode 4.

According to the second embodiment, it is possible to provide the nitride-based semiconductor device capable of operating as the diode having a low on-state voltage and a low reverse-bias leak current while the electric field concentration to the edge of the anode electrode 3 is relieved to implement a high breakdown voltage.

Figure 13A:
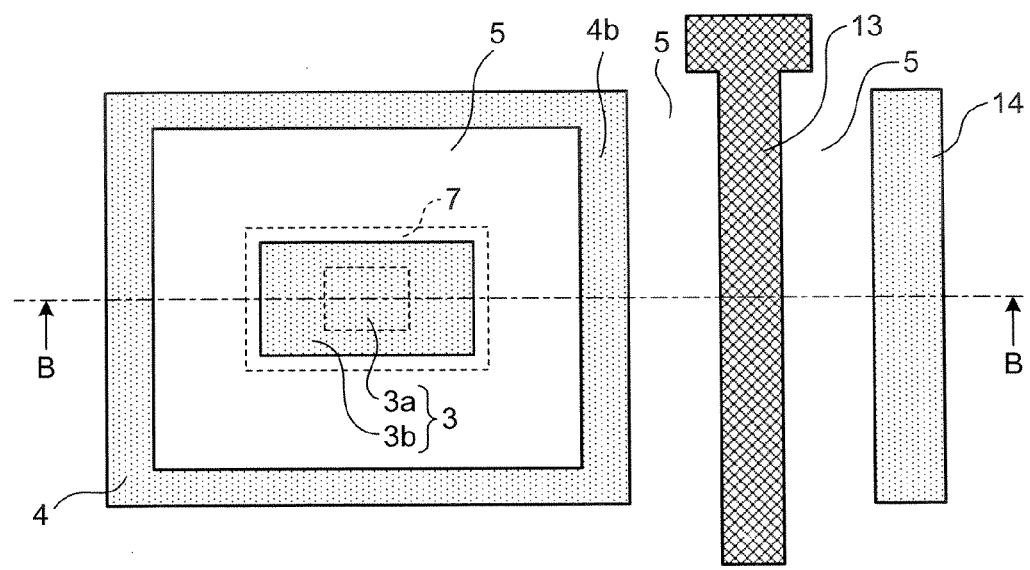
FIG. 13A is a schematic plan view of a nitride-based semiconductor device according to a third embodiment.
Figure 13B:
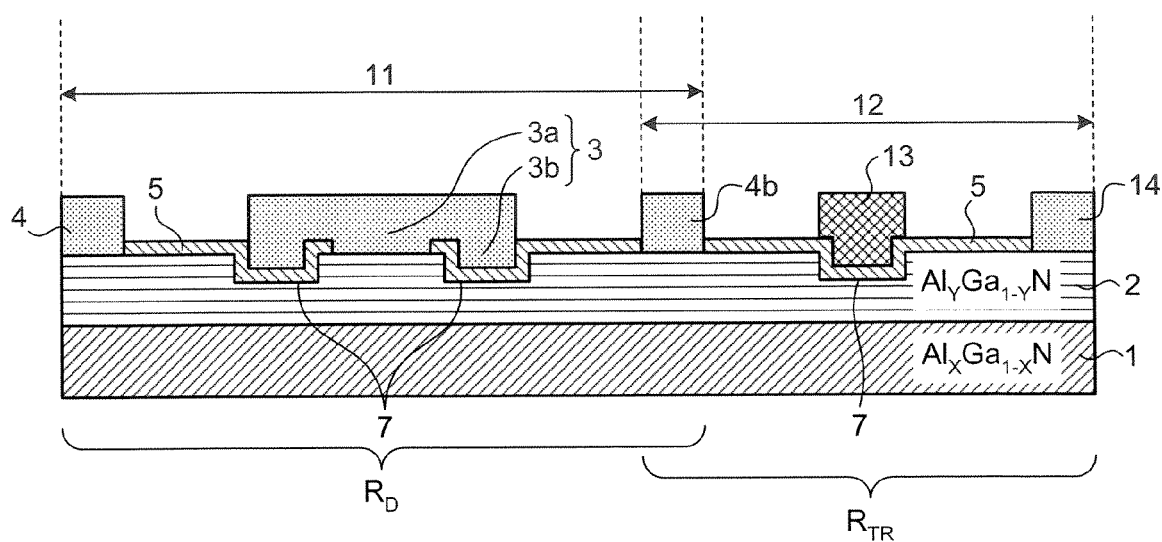
FIG. 13B is a cross-sectional view taken along the line B-B of FIG. 13A.

FIG. 13A is a schematic plan view of a nitride-based semiconductor device according to a third embodiment. FIG. 13B is a cross-sectional view taken along the line B-B of FIG. 13A. The nitride-based semiconductor device is structured to form a diode 11 which are explained in the first embodiment and a field effect transistor 12 on the same substrate. Hereinafter, a region on the substrate where the diode 11 is formed is called "diode forming region $R_D$", and a region where the field effect transistor 12 is formed is called "transistor forming region $R_{TR}$".

The nitride-based semiconductor device has a structure (hereinafter, "laminated body") in which the carrier traveling layer 1 made of $Al_XGa_{1-X}N$ ($0 \leq X < 1$) being a non-doped nitride-based semiconductor, and the barrier layer 2 made of $Al_YGa_{1-Y}N$ ($0 < Y \leq 1$, $X < Y$) being a non-doped or n-type nitride-based semiconductor having a lattice constant smaller than that of the carrier traveling layer 1 are successively laminated on a substrate (not shown). Here, the carrier traveling layer 1 corresponds to the first nitride-based semiconductor layer, and similarly, the barrier layer 2 corresponds to the second nitride-based semiconductor layer, in the appended claims.

The diode 11 is formed in the diode forming region $R_D$ of the laminated body, but has basically the same structure as that in the first embodiment, and therefore, explanation of the details is omitted. However, the example of FIG. 13A shows that the planar shape of the anode electrode 3 is a rectangle and the planar shape of the cathode electrode 4 is a rectangular frame (like a picture frame) which is provided apart from the peripheral portion 3b of the anode electrode 3 by a predetermined distance and surrounds the anode electrode 3. A part of the cathode electrode 4 formed in its transistor forming region $R_{TR}$ side serves also as a source electrode 4b of the field effect transistor 12. Here, the anode electrode 3 corresponds to the first electrode and the cathode electrode 4 corresponds to the second electrode, in the appended claims.

The field effect transistor 12 is formed in the transistor forming region $R_{TR}$ of the laminated body, and the source electrode 4b serves also as a part of the cathode electrode 4 of the diode 11. Another recess structure 7 obtained by removing a part of the barrier layer 2 is formed at the position on the barrier layer 2 where a gate electrode 13 is formed. The recess structure 7 is formed almost parallel to the direction to which the source electrode 4b is formed. Further, a drain electrode 14 is formed at the position on the barrier layer 2 which is almost symmetric to the source electrode 4b with respect to this recess structure 7, and formed almost parallel to the direction to which the source electrode 4b is formed. An insulating film 5 is formed on the barrier layer 2 including the recess structure 7 between the source electrode 4b and the drain electrode 14. The insulating film 5 serves as a gate insulating film in the recess structure 7, and the gate electrode 13 is formed on this insulating film 5.

Because the operation of the diode 11 is as explained in the first embodiment, the explanation thereof is omitted herein, and the outline of the operation of the field effect transistor 12 is explained below. Similarly to the diode 11, the field effect transistor 12 is also formed on the laminated body in which the carrier traveling layer 1 and the barrier layer 2, of which lattice constant is smaller than that of the carrier traveling layer 1, are laminated. Therefore, the two-dimensional electron gas is formed between the carrier traveling layer 1 and the barrier layer 2 by piezoelectric charge due to distortion of the barrier layer 2. When a negative voltage is applied to the gate electrode 13 formed on the recess structure 7 in the barrier layer 2, a depletion layer is formed in the barrier layer 2 below the gate electrode 13, similarly to the peripheral portion 3b of the anode electrode 3 in the diode explained with reference to FIG. 4, which prevents movement of electrons. This causes the carrier not to flow between the source electrode 4b and the drain electrode 14. On the other hand, when a positive voltage is applied to the gate electrode 13, the carrier is injected into the barrier layer 2 below the gate electrode 13, which causes the carrier to flow between the source electrode 4b and the drain electrode 14. The transistor operation of the field effect transistor 12 is performed by turning on/off the voltage to be applied to the gate electrode 13 in the above manner.

Figure 14A:
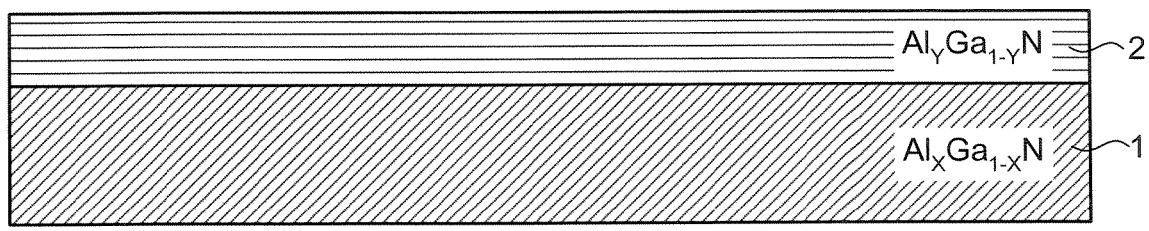
FIG. 14A to FIG. 14I are schematic cross-sectional views of one example of a procedure for a method of manufacturing the nitride-based semiconductor device according to the third embodiment.

The method of manufacturing the nitride-based semiconductor device, in which the diode 11 and the field effect transistor 12 shown in FIG. 13A and FIG. 13B are formed on the same substrate, is explained below. FIG. 14A to FIG. 14I are schematic cross-sectional views of one example of a procedure for the method of manufacturing the nitride-based semiconductor device according to the third embodiment. At first, as shown in FIG. 14A, the carrier traveling layer 1 and the barrier layer 2 are successively grown in the diode forming region $R_D$ and the transistor forming region $R_{TR}$ on a substrate (not shown) on which a predetermined film is formed if necessary. Specifically, the carrier traveling layer 1 is made of a non-doped $Al_XGa_{1-X}N$ ($0 \leqq X<1$) film of about 2 μm, and the barrier layer 2 is made of a non-doped or n-type $Al_YGa_{1-Y}N$ ($0<Y\leqq 1$, X<Y) film of about 20 nm. The carrier traveling layer 1 and the barrier layer 2 are formed by using the epitaxial crystal growth technique such as the MOCVD method that can control the film thickness at a level of atomic layer. The film thickness of the barrier layer 2 needs to be thinner than the film thickness in which dislocation occurs. Therefore, the crystal of a semiconductor film that forms the barrier layer 2 is grown according to the crystal structure of the carrier traveling layer 1 as the lower layer, extended in the direction parallel to the growth surface, and has a distortion.

Figure 14B:
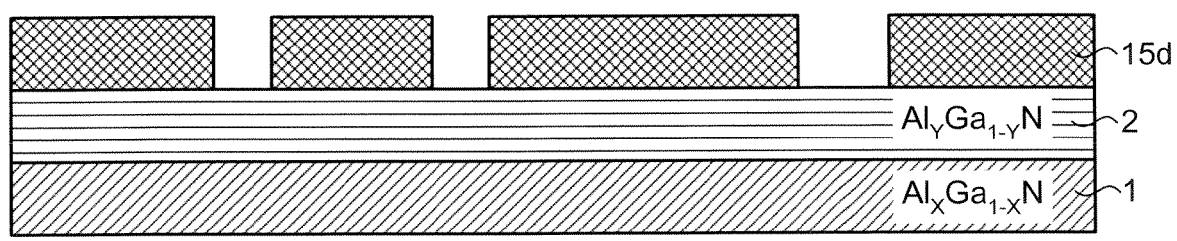

As shown in FIG. 14B, a photoresist film 15d is applied to the barrier layer 2, and the photoresist film 15d is exposed and developed by the photolithography technique, to form an etching mask obtained by removing the photoresist film 15d at the position where the recess structure 7 is formed.

Figure 14C:
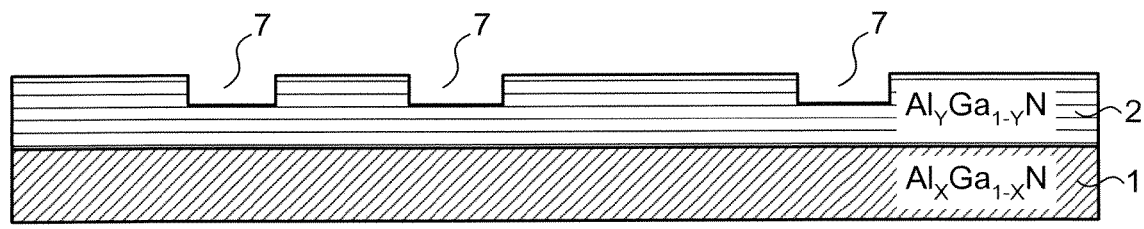

As shown in FIG. 14C, by using the etching mask, parts of the barrier layer 2 are selectively removed to a predetermined depth by the technique such as the reactive ion etching method, to form the recess structure 7. Then, the photoresist film 15d used is removed.

Figure 14D:
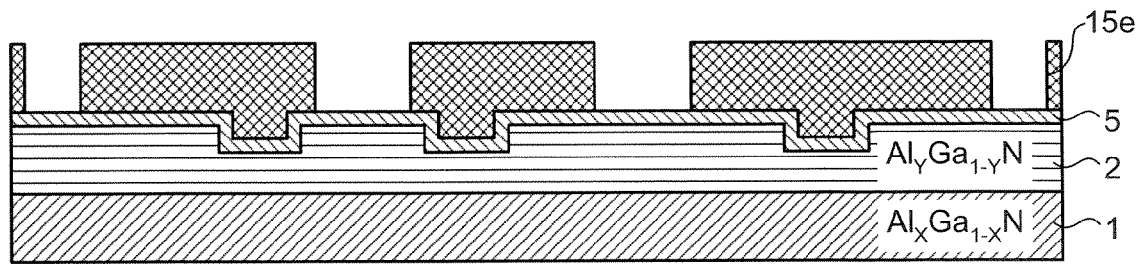

As shown in FIG. 14D, the insulating film 5 is formed over the whole surface of the barrier layer 2, and then, a photoresist film 15e is applied to the insulating film 5. Thereafter, the photoresist film 15e is exposed and developed by the photolithography technique so that the photoresist film 15e in regions corresponding to electrodes directly formed on the barrier layer 2 is removed, to form an etching mask. Specifically, the electrodes are the cathode electrode 4 (including the source electrode 4b in the field effect transistor 12) and the central portion 3a of the anode electrode 3 in the diode 11, and the drain electrode 14 in the field effect transistor 12.

Figure 14E:
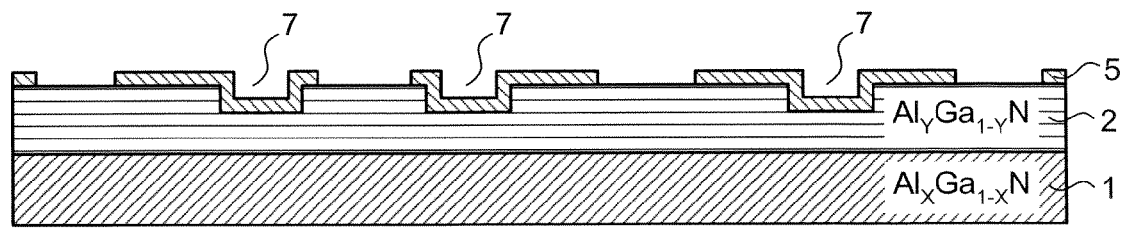

As shown in FIG. 14E, parts of the insulating film 5 are selectively removed by the technique such as the reactive ion etching method using the etching mask, the barrier layer 2 is exposed, and then, the photoresist film 15e is removed.

Figure 14F:
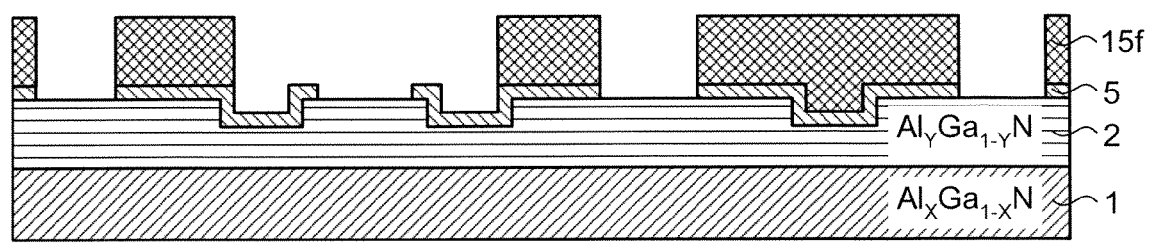

As shown in FIG. 14F, a new photoresist film 15f is applied to the entire surface of the barrier layer 2 on a part of which the insulating film 5 is formed, and then, the photoresist film 15f is exposed and developed by the photolithography technique to remove the photoresist film 15f in the predetermined regions corresponding to the positions where the electrodes are formed. In this case, the photoresist film 15f is removed from the regions in the diode 11 where the anode electrode 3 and the cathode electrode 4 (including the source electrode 4b in the field effect transistor 12) are formed and from the region in the field effect transistor 12 where the drain electrode 14 is formed.

Figure 14G:
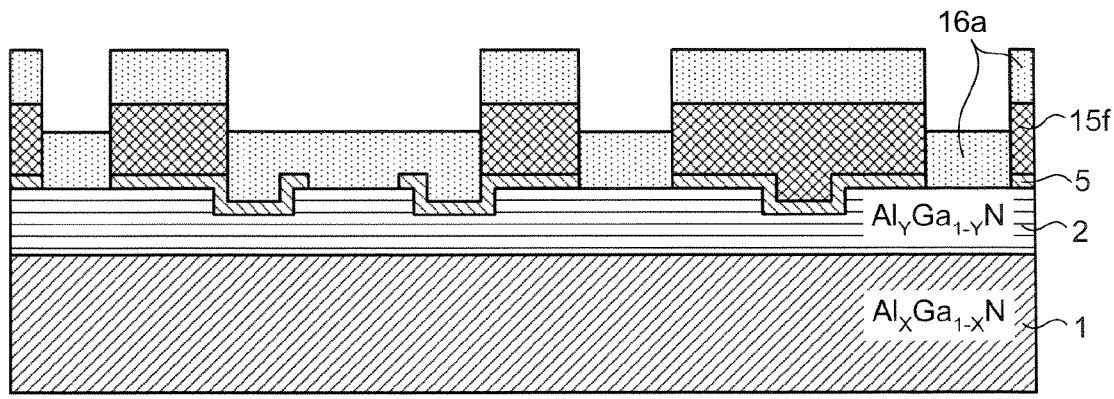

As shown in FIG. 14G, a conductive material film 16a for electrodes is deposited, by a predetermined thickness, on the entire surface in the side where the photoresist film 15f is formed. Specifically, the conductive material film 16a is metal or the like of which the anode electrode 3, the cathode electrode 4 (including the source electrode 4b), and the drain electrode 14 are made. Thereafter, the photoresist film 15f and the conductive material film 16a are removed, by using the lift-off method, from regions other than the regions where the anode electrode 3, the cathode electrode 4 (including the source electrode 4b), and the drain electrode 14 are formed. The anode electrode 3, the cathode electrode 4 (including the source electrode 4b), and the drain electrode 14 are thereby formed with the conductive material film 16a remaining.

Figure 14H:
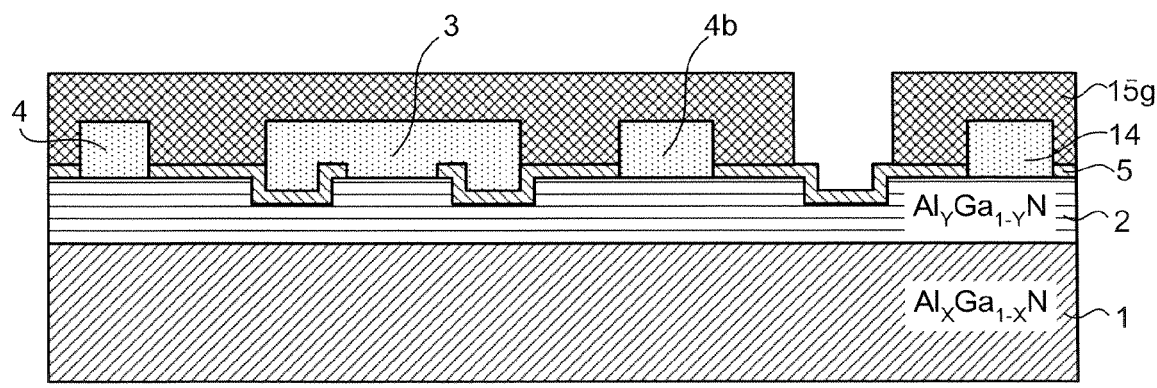

As shown in FIG. 14H, a new photoresist film 15g is applied on the surface in the side where the electrodes are formed, and then, the photoresist film 15g is exposed and developed by the photolithography technique to remove the photoresist film 15g in a predetermined region corresponding to the position where an electrode is formed. In this case, the photoresist film 15g is removed from the region in the field effect transistor 12 where the gate electrode 13 is formed.

Figure 14I:
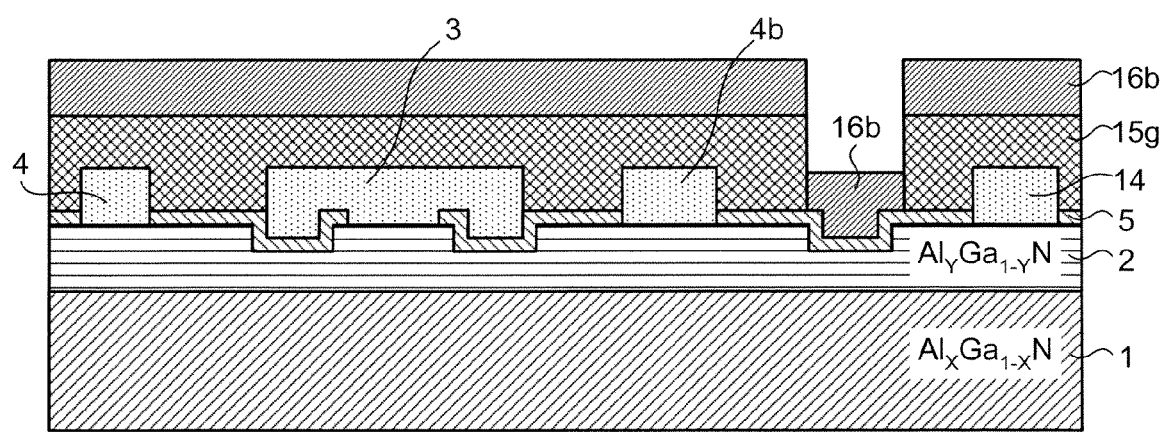

As shown in FIG. 14I, a conductive material film 16b for electrodes such as metal, of which the gate electrode 13 is made, is deposited by a predetermined thickness on the entire surface in the side where the photoresist film 15g is formed. Thereafter, the photoresist film 15g and the conductive material film 16b are removed, by using the lift-off method, from regions other than the region where the gate electrode 13 is formed. The gate electrode 13 is thereby formed with the conductive material film 16b remaining. The nitride-based semiconductor device in which the diode 11 and the field effect transistor 12 shown in FIG. 13A and FIG. 13B are formed on the same substrate is obtained in the above manner.

In the method of manufacturing the nitride-based semiconductor device, the recess structure 7 below the peripheral portion 3b of the anode electrode 3 in the diode 11 and the recess structure 7 below the gate electrode 13 in the field effect transistor 12 can be simultaneously formed. Moreover, the insulating film 5 provided between the peripheral portion 3b of the anode electrode 3 in the diode 11 and the barrier layer 2, and the gate insulating film (insulating film 5) provided for the gate electrode 13 in the field effect transistor 12 can be shared and simultaneously formed. This allows reduction in the number of manufacturing processes.

In the process of forming the recess structure 7, to make the density of the two-dimensional electron gas zero in this region and minimize the reverse-bias leak current, the thickness of the barrier layer 2 below the recess structure 7 is desirably set to a value not more than the critical thickness Tc represented by the equation (3).

In the above example, the electrode shared for both the cathode electrode 4 and the source electrode 4b is used, but some electrodes among the anode electrode 3, the cathode electrode 4, the source electrode 4b, the gate electrode 13, and the drain electrode 14 may be freely combined for sharing or such sharing does not have to be done depending on circuit design.

According to the third embodiment, it is possible to form a circuit device, which combines the diode 11 and the field effect transistor 12, on the same substrate by using a wide-gap semiconductor device with high breakdown voltage and low loss. As a result, when the circuit device is used for a circuit such as an inverter, the circuit device with low loss and high breakdown voltage can be provided. Furthermore, by forming the diode 11 and the field effect transistor 12 on the same substrate, the number of components can be largely reduced.

Figure 15:
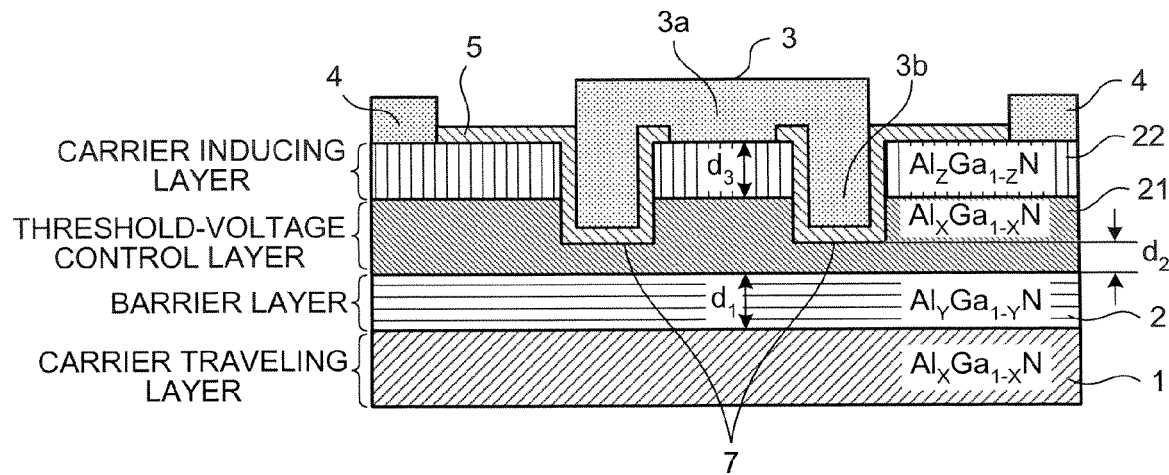
FIG. 15 is a schematic cross-sectional view of a nitride-based semiconductor device according to a fourth embodiment.

FIG. 15 is a schematic cross-sectional view of a nitride-based semiconductor device according to a fourth embodiment. The nitride-based semiconductor device is such that the carrier traveling layer 1 made of $Al_xGa_{1-x}N$ ($0 \leq X < 1$) being a non-doped nitride-based semiconductor, the barrier layer 2 made of $Al_yGa_{1-y}N$ ($0 < Y \leq 1$, $X < Y$) being a non-doped or n-type nitride-based semiconductor having a lattice constant smaller than that of the carrier traveling layer 1, a threshold-voltage control layer 21, and a carrier inducing layer 22 are successively laminated on a substrate (not shown). Specifically, the threshold-voltage control layer 21 is made of a non-doped or n-type semiconductor having a lattice constant equal to that of the carrier traveling layer 1, and the carrier inducing layer 22 is made of a non-doped or n-type semiconductor having a lattice constant smaller than that of the carrier traveling layer 1. The anode electrode 3 and the cathode electrode 4 which surrounds the anode electrode 3 are formed on the carrier inducing layer 22. The planar structure corresponding to the cross-section of the nitride-based semiconductor device of FIG. 15 is, for example, the structure as shown in FIG. 1A.

More specifically, the planar shape of the anode electrode 3 is a circle, and the planar shape of the cathode electrode 4 is a circular ring shape formed spaced from the peripheral portion 3b of the anode electrode 3 by a predetermined distance so as to surround the anode electrode 3. However, this is only one example, and therefore, any shape may be used if the anode electrode 3 is surrounded by the cathode electrode 4 or by the cathode electrode 4 and the element separating region 8. Furthermore, it is desirable to use any material capable of ohmic contact with the nitride-based semiconductor, for the anode electrode 3 and the cathode electrode 4.

The recess structure 7 is formed by removing the whole of the carrier inducing layer 22 and a part of the threshold-voltage control layer 21, at the position on the carrier inducing layer 22 corresponding to the peripheral portion 3b which is provided outwardly of the central portion 3a of the anode electrode 3. The insulating film 5 is formed between the circumference of the region surrounded by the recess structure 7 in the carrier inducing layer 22 and the position where the cathode electrode 4 is formed. However, all the region surrounded by the recess structure 7 in the carrier inducing layer 22 should not be covered with the insulating film 5. With this feature, the anode electrode 3 is directly formed on the carrier inducing layer 22 in its central portion 3a, but is formed on the threshold-voltage control layer 21, through the insulating film 5, in its peripheral portion 3b which is more outward (the recess structure 7 in the barrier layer 2) than the central portion 3a. As a result, the carrier inducing layer 22 in the peripheral portion 3b is removed to make lower the two-dimensional electron density below the peripheral portion 3b than that below the central portion 3a of the anode electrode 3.

In FIG. 15, the recess structure 7 is structured by removing the whole of the carrier inducing layer 22 and a part of the threshold-voltage control layer 21 in the region corresponding to the peripheral portion 3b of the anode electrode 3. However, the recess structure 7 may also be structured by removing only the carrier inducing layer 22 because the nitride-based semiconductor device according to the fourth embodiment can be operated as a diode as long as the recess structure 7 is not formed in the barrier layer 2 and the carrier inducing layer 22 is removed. In the example of FIG. 15, the central portion 3a of the anode electrode 3 and the cathode electrode 4 in the diode 11 are formed on the carrier inducing layer 22, but are only necessary to be formed in any one of the carrier inducing layer 22, the threshold-voltage control layer 21, and the barrier layer 2. Here, the carrier traveling layer 1 corresponds to the first nitride-based semiconductor layer, and similarly, the barrier layer 2 corresponds to the second nitride-based semiconductor layer, the threshold-voltage control layer 21 corresponds to a first semiconductor layer, the carrier inducing layer 22 corresponds to a second semiconductor layer, the anode electrode 3 corresponds to the first electrode, and the cathode electrode 4 corresponds to the second electrode, in the appended claims.

As explained above, the threshold-voltage control layer 21 is formed with a semiconductor material having the same lattice constant as that of the carrier traveling layer 1. However, as shown in FIG. 15, if the threshold-voltage control layer 21 and the carrier traveling layer 1 are made of the same material such as $Al_xGa_{1-x}N$ ($0 \leq X < 1$), both the layers can be manufactured by one type of crystal growth apparatus. Therefore, using the same material is more advantageous as compared with materials which are different from each other but have the same lattice constant. Similarly, the carrier inducing layer 22 is formed with a semiconductor material having the lattice constant smaller than that of the carrier traveling layer 1. However, as shown in FIG. 15, if $Al_ZGa_{1-Z}N$ ($0<Z\leqq1$, $X<Z$) film is used, crystal growth is possible by using the same material as that of the barrier layer 2. Consequently, using the same material is more advantageous as compared with using different materials.

The thickness of the barrier layer 2 is set to a value not more than a thickness in which dislocation occurs caused by distortion due to a difference in the lattice constant between the barrier layer 2 and the carrier traveling layer 1, and actually, the barrier layer 2 has a thickness of about tens of nanometers. Therefore, the lattice constant of the barrier layer 2 becomes substantially the same as that of the carrier traveling layer 1, and the barrier layer 2 has a crystal structure extended in the direction parallel to the substrate surface. This causes the threshold-voltage control layer 21 formed on the barrier layer 2 to have the same lattice constant as that of the carrier traveling layer 1. Therefore, a new distortion does not occur between the threshold-voltage control layer 21 and the barrier layer 2.

Similarly, the thickness of the carrier inducing layer 22 is set to a value not more than a film thickness in which dislocation occurs caused by distortion due to a difference in the lattice constant between the carrier inducing layer 22 and the threshold-voltage control layer 21, and actually, the carrier inducing layer 22 has a thickness of about tens of nanometers. Therefore, the lattice constant of the carrier inducing layer 22 becomes substantially the same as that of the threshold-voltage control layer 21, and the carrier inducing layer 22 has a crystal structure extended in the direction parallel to the substrate surface. In the following explanation, it is assumed that $d_1$ indicates the thickness of the barrier layer 2, $d_2$ indicates the thickness of the threshold-voltage control layer 21 at the position where the recess structure 7 is formed, and $d_3$ indicates the thickness of the carrier inducing layer 22.

The film thickness $d_1$ of the barrier layer 2 below the peripheral portion 3b (recess structure 7) of the anode electrode 3 is made different from the total thickness $d_1+d_3$ of the barrier layer 2 and the carrier inducing layer 22 at the central portion 3a of the anode electrode 3 or between the peripheral portion 3b of the anode electrode 3 and the cathode electrode 4. In other words, the thickness of the anode electrode 3 is designed to be different in the respective regions such as the central portion 3a and the peripheral portion 3b. By virtue of having such a construction, the two-dimensional electron density can be set to predetermined values in the respective regions. However, the total thickness $d_1+d_3$ of the barrier layer 2 and the carrier inducing layer 22 needs to be larger than the critical thickness Tc in the equation (3), because the carrier needs to exist between the anode electrode 3 and the cathode electrode 4. Further, if the film thickness d1 of the barrier layer 2 is set to a value not more than the critical thickness Tc in the equation (3), the carrier density at the interface between the barrier layer 2 and the carrier traveling layer 1 below the peripheral portion 3b (recess structure 7) of the anode electrode 3 can be made zero, thus minimizing the reverse-bias leak current.

The method of manufacturing the nitride-based semiconductor device according to the fourth embodiment is the same as that explained in the first embodiment except for different points as explained below, and explanation of the details is therefore omitted. One of the different points is such that, unlike FIG. 7A, the carrier traveling layer 1 made of a non-doped $Al_XGa_{1-X}N$ ($0\leqq X<1$) film of about 2 μm, the barrier layer 2 made of a non-doped or n-type $Al_YGa_{1-Y}N$ ($0<Y\leqq1$, $X<Y$) film of about 10 nm, the threshold-voltage control layer 21 made of a non-doped or n-type $Al_XGa_{1-X}N$ ($0\leqq X<1$) film of about 10 nm, and the carrier inducing layer 22 made of a non-doped or n-type $Al_ZGa_{1-Z}N$ ($0<Z\leqq1$, $X<Z$) film of about 10 nm are successively grown on a substrate (not shown) on which a predetermined film is formed if necessary. The other different point is such that, unlike FIG. 7C, when the recess structure 7 is formed, the whole of the carrier inducing layer 22 and a part of the threshold-voltage control layer 21 are selectively removed to a predetermined depth in the threshold-voltage control layer 21.

However, the total thickness $d_1+d_3$ of the barrier layer 2 and the carrier inducing layer 22 needs to be formed so as to be larger than the critical thickness Tc in the equation (3). Further, to obtain the nitride-based semiconductor device that suppresses the reverse-bias leak current, the film thickness $d_1$ of the barrier layer 2 below the peripheral portion 3b (recess structure 7) of the anode electrode 3 is simply set to a value not more than the critical thickness Tc in the equation (3).

As explained above, in the fourth embodiment, the recess structure 7 corresponding to the peripheral portion 3b of the anode electrode 3 is formed not between the surface of the nitride-based semiconductor device and the part of the barrier layer 2, unlike the first embodiment, but between the surface of the nitride-based semiconductor device according to the fourth embodiment and the threshold-voltage control layer 21 which is the upper layer of the barrier layer 2. Specifically, the nitride-based semiconductor device according to the fourth embodiment is obtained by successively laminating the carrier traveling layer 1, the barrier layer 2 having the lattice constant smaller than that of the carrier traveling layer 1, the threshold-voltage control layer 21 having the same lattice constant as that of the carrier traveling layer 1, and the carrier inducing layer 22 having the lattice constant smaller than that of the carrier traveling layer 1, on the substrate. Furthermore, the total thickness $d_1+d_3$ Of the barrier layer 2 and the carrier inducing layer 22 is set to be larger than the critical thickness Tc in the equation (3).

According to the fourth embodiment, in the nitride-based semiconductor device in which the total thickness $d_1+d_3$ of the barrier layer 2 and the carrier inducing layer 22 is larger than the critical thickness Tc in the equation (3), the central portion 3a of the anode electrode 3 is directly formed on the carrier inducing layer 22, the peripheral portion 3b is formed, through the insulating film 5, on the threshold-voltage control layer 21 where the recess structure 7 is formed, and the cathode electrode 4 is formed on the carrier inducing layer 22. It is thereby possible to obtain the nitride-based semiconductor device capable of operating as the diode that can suppress the reverse-bias leak current to a low level when the reverse bias is applied to the anode electrode 3, and that has a low on-state voltage when the forward bias is applied to the anode electrode 3. Furthermore, by setting the film thickness $d_1$ of the barrier layer 2 to a value not more than the critical thickness Tc in the equation (3), the reverse-bias leak current can be suppressed.

In the field effect transistor 12 of the nitride-based semiconductor device according to the third embodiment, the gate electrode 13 is formed on the recess structure 7 obtained by removing the part of the barrier layer 2 using etching. However, in the field effect transistor 12 having such a structure as above, a threshold voltage changes depending on the Al composition ratio in the barrier layer 2 and the thickness of the barrier layer 2 below the gate electrode 13 (recess structure 7). For example, when the Al composition ratio Y in the barrier layer 2 is 0.3, even if processing is performed with a precision of 10 [Å] on variation in the thickness of the barrier layer 2 below the gate electrode 13 caused by the etching for forming the recess structure 7, the variation in the threshold voltage at this time becomes as large as 0.3 [V]. In other words, in the nitride-based semiconductor device according to the third embodiment, if a plurality of field effect transistors 12 are present on the same substrate, it takes a comparatively troublesome to suppress the variation in the threshold voltage. Therefore, in a fifth embodiment, a nitride-based semiconductor device capable of suppressing the variation in the threshold voltage of a plurality of diodes 11 and field effect transistors 12 formed on the same substrate is explained below.

Figure 16:
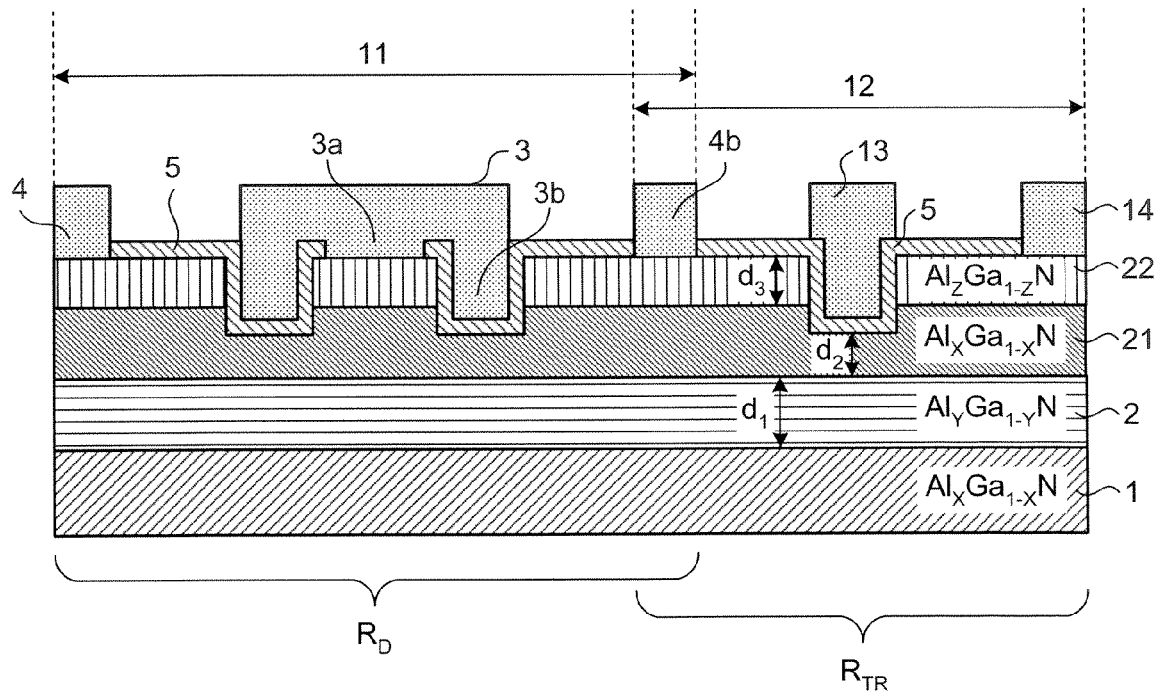
FIG. 16 is a schematic cross-sectional view of a nitride-based semiconductor device according to a fifth embodiment.

FIG. 16 is a schematic cross-sectional view of the nitride-based semiconductor device according to the fifth embodiment. The nitride-based semiconductor device has the diode 11 explained in the fourth embodiment and the field effect transistor 12 which are formed on the same substrate. Hereinafter, the region on the substrate where the diode 11 is formed is called "diode forming region $R_D$", and the region where the field effect transistor 12 is formed is called "transistor forming region $R_{TR}$".

The nitride-based semiconductor device has a structure (hereinafter, "laminated body") in which the carrier traveling layer 1 made of $Al_XGa_{1-X}N$ ($0 \leq X < 1$) being a non-doped nitride-based semiconductor, the barrier layer 2 made of $Al_YGa_{1-Y}N$ ($0 < Y \leq 1$, $X < Y$) being a non-doped or n-type nitride-based semiconductor having the lattice constant smaller than that of the carrier traveling layer 1, the threshold-voltage control layer 21 made of a non-doped or n-type semiconductor having the lattice constant equal to that of the carrier traveling layer 1, and the carrier inducing layer 22 made of a non-doped or n-type semiconductor having the lattice constant smaller than that of the carrier traveling layer 1 are successively laminated on the substrate (not shown). Here, the carrier traveling layer 1 corresponds to the first nitride-based semiconductor layer, and similarly, the barrier layer 2 corresponds to the second nitride-based semiconductor layer, the threshold-voltage control layer 21 corresponds to the first semiconductor layer, and the carrier inducing layer 22 corresponds to the second semiconductor layer, in the appended claims.

The diode 11 is formed in the diode forming region $R_D$ of the laminated body, but has basically the same structure as that explained in the fourth embodiment, and therefore, explanation of its details is omitted. Here, the case where the planar structure corresponding to the cross-section of FIG. 16 is the one shown in FIG. 13A is exemplified. More specifically, it is shown that the planar shape of the anode electrode 3 is a rectangle and the planar shape of the cathode electrode 4 is a rectangular frame (like a picture frame) which is provided apart from the peripheral portion 3b of the anode electrode 3 by a predetermined distance so as to surround the anode electrode 3. A part of the cathode electrode 4 formed in its transistor forming region $R_{TR}$ side serves also as the source electrode 4b of the field effect transistor 12. Here, the anode electrode 3 corresponds to the first electrode and the cathode electrode 4 corresponds to the second electrode, in the appended claims.

The field effect transistor 12 is formed in the transistor forming region $R_{TR}$ of the laminated body, and the source electrode 4b serves also as a part of the cathode electrode 4 of the diode 11. The recess structure 7 obtained by removing the whole of the carrier inducing layer 22 and a part of the threshold-voltage control layer 21 is formed at the position on the carrier inducing layer 22 where the gate electrode 13 is formed. The recess structure 7 is formed almost parallel to the direction to which the source electrode 4b is formed. Further, the drain electrode 14 is formed at a position on the carrier inducing layer 22 which is almost symmetric to the source electrode 4b with respect to this recess structure 7, and formed almost parallel to the direction to which the source electrode 4b is formed. The insulating film 5 is formed on the carrier inducing layer 22 including the recess structure 7 between the source electrode 4b and the drain electrode 14. The insulating film 5 serves as a gate insulating film in the recess structure 7, and the gate electrode 13 is formed on this insulating film 5.

Figure 17:
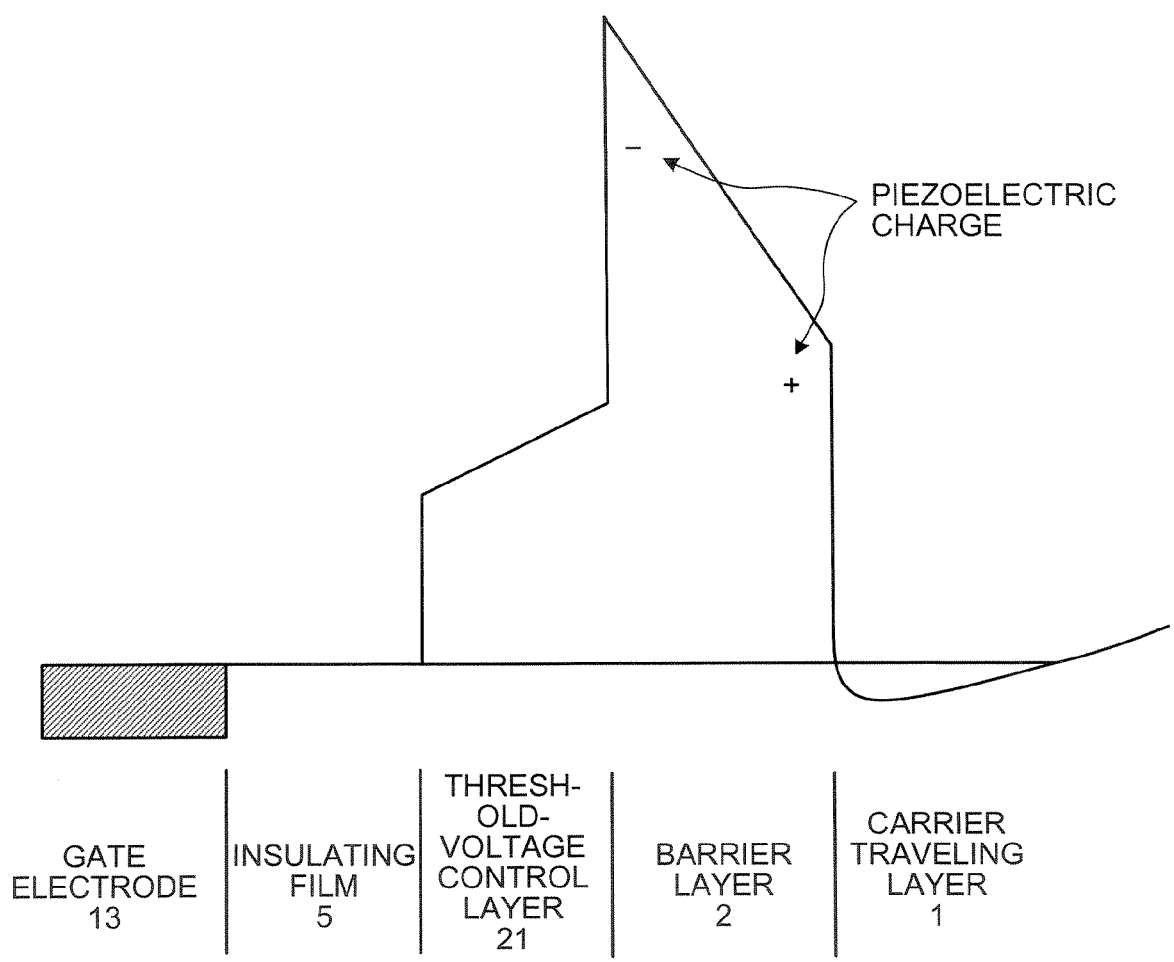
FIG. 17 is a schematic view of an energy state of a conduction band in the depth direction at the position where the gate electrode of FIG. 16 is formed.
Figure 18:
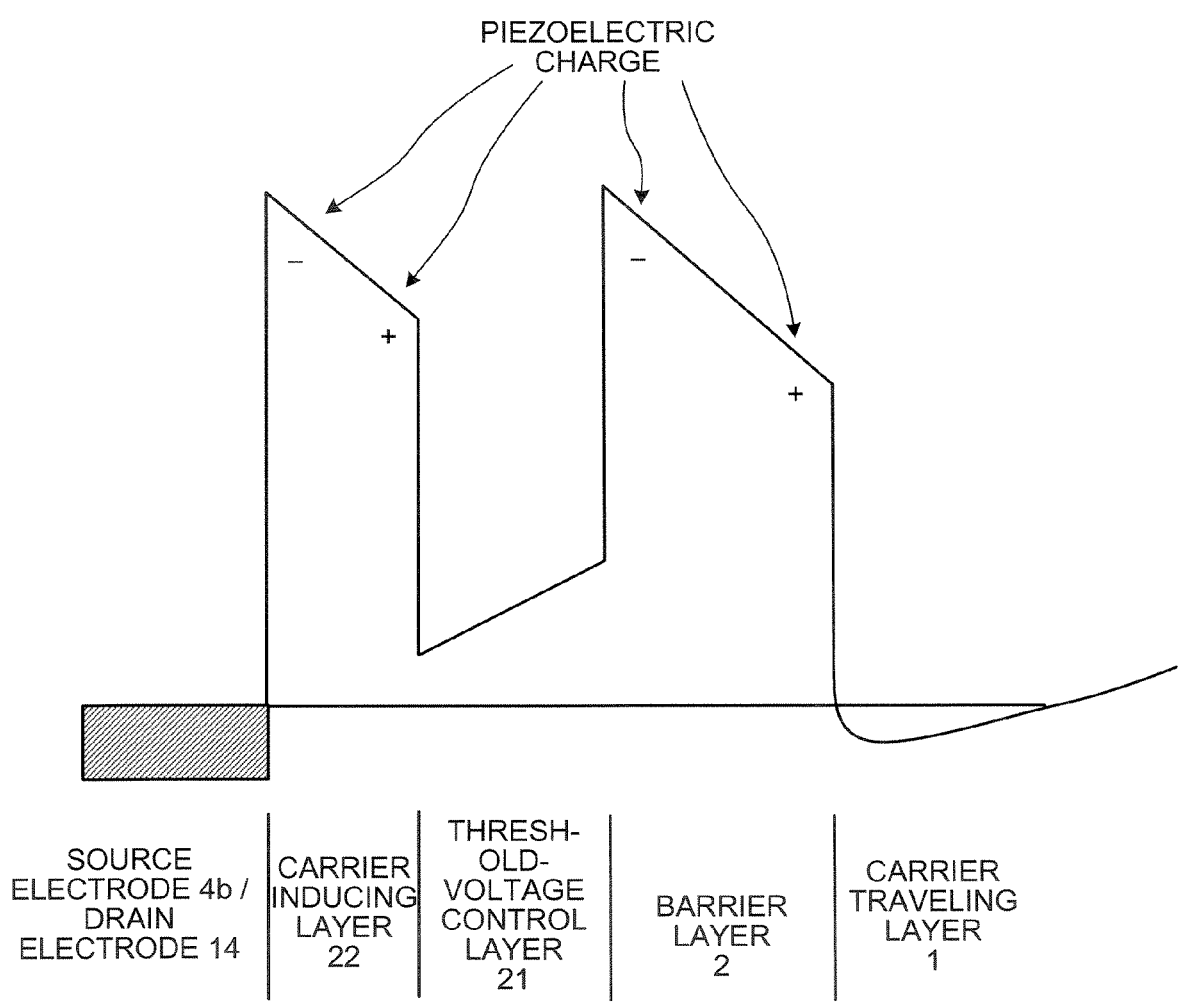
FIG. 18 is a schematic view of an energy state of a conduction band in the depth direction at the position where the source electrode/the drain electrode of FIG. 16 is formed.

Because the operation of the diode 11 is as explained in the first and the fourth embodiments, the explanation thereof is omitted herein, and the outline of the operation of the field effect transistor 12 is explained below. FIG. 17 is a schematic view of an energy state of a conduction band in the depth direction at the position where the gate electrode of FIG. 16 is formed. FIG. 18 is a schematic view of an energy state of a conduction band in the depth direction at the position where the source electrode 4b or the drain electrode 14 of FIG. 16 is formed.

The peripheral portion 3b of the anode electrode 3 is formed on the threshold-voltage control layer 21, and, as shown in FIG. 17, a piezoelectric charge is thereby produced only in the barrier layer 2 but not in the threshold-voltage control layer 21, at the position where the peripheral portion 3b is formed. Therefore, the piezoelectric charge density does not depend on the film thickness $d_2$ of the threshold-voltage control layer 21 below the peripheral portion 3b of the anode electrode 3. Further, the piezoelectric charge density does not change. Consequently, the carrier density is reduced with respect to an increase in the film thickness of the threshold-voltage control layer 21. In other words, it is known that the carrier density is inversely proportional to the total thicknesses of the barrier layer 2 and the threshold-voltage control layer 21. Meanwhile, a gate capacity per unit area is inversely proportional to the total thickness of the barrier layer 2 and the threshold-voltage control layer 21. From this relationship, the threshold voltage represented by [carrier density of two-dimensional electron system under gate electrode 13]/[gate capacity per unit area] does not vary with respect to the total thickness of the barrier layer 2 and the threshold-voltage control layer 21.

Specifically, in the field effect transistor 12 of the nitride-based semiconductor device shown in FIG. 16, the threshold voltage does not vary with respect to the variation in the etching depth upon forming the recess structure 7. More specifically, the threshold voltage does not vary even if the film thickness $d_2$, which is left in the threshold-voltage control layer 21, varies. Further, the barrier layer 2, which is not removed upon forming the recess structure 7 as explained later, is formed by a film-forming technique that enables a crystal growth with atomic layer control, to thereby enable strict film-thickness control.

On the other hand, the carrier inducing layer 22 is formed in a region between the source electrode 4b and the gate electrode 13 and in a region between the drain electrode 14 and the gate electrode 13, in both of which the recess structure 7 is not formed. Because the carrier inducing layer 22 has the lattice constant smaller than that of the carrier traveling layer 1 and the threshold-voltage control layer 21, as shown in FIG. 18, the piezoelectric charge that is positive at the side of the threshold-voltage control layer 21 is produced in the carrier inducing layer 22. The potential of the conduction band in the carrier inducing layer 22 has a slope due to the piezoelectric charge, namely, the potential at the side of the carrier traveling layer 1 is low.

Similarly to FIG. 17, the piezoelectric charge is also produced in the barrier layer 2. Therefore, the carrier density of the two-dimensional electron system increases at the interface between the carrier traveling layer 1 and the barrier layer 2 below the region where the carrier inducing layer 22 is formed. Specifically, the resistance of the two-dimensional electron system below the region where the carrier inducing layer 22 is formed decreases. As a result, in the nitride-based semiconductor device of FIG. 16 in which the carrier inducing layer 22 is formed between the source electrode 4b and the gate electrode 13 and between the drain electrode 14 and the gate electrode 13, the resistance between the source electrode 4b and the gate electrode 13 and between the drain electrode 14 and the gate electrode 13 is reduced, whereby reduced on-resistance can be realized.

The method of manufacturing the nitride-based semiconductor device according to the fifth embodiment is the same as that explained in the third embodiment except for different points as explained below, and explanation of the details is therefore omitted. One of the different points is such that, unlike FIG. 14A, the carrier traveling layer 1 made of a non-doped $Al_XGa_{1-X}N$ ($0 \leq X<1$) film of about 2 μm, the barrier layer 2 made of a non-doped or n-type $Al_YGa_{1-Y}N$ ($0<Y \leq 1$, X<Y) film of about 10 nm, the threshold-voltage control layer 21 made of a non-doped or n-type $Al_XGa_{1-X}N$ ($0 \leq X<1$) film of about 10 nm, and the carrier inducing layer 22 made of a non-doped or n-type $Al_ZGa_{1-Z}N$ ($0<Z \leq 1$, X<Z) film of about 10 nm are successively grown on a substrate (not shown) where a predetermined film is formed if necessary. The other different point is such that, unlike FIG. 14C, when the recess structure 7 is formed, the whole of the carrier inducing layer 22 and a part of the threshold-voltage control layer 21 are selectively removed to a predetermined depth in the threshold-voltage control layer 21.

However, the total thickness $d_1+d_3$ of the barrier layer 2 and the carrier inducing layer 22 needs to be formed so as to be larger than the critical thickness Tc in the equation (3). Further, to obtain the nitride-based semiconductor device that suppresses the reverse-bias leak current, the film thickness $d_1$ of the barrier layer 2 below the peripheral portion 3b (recess structure 7) of the anode electrode 3 is simply set to a value not more than the critical thickness Tc in the equation (3). Consequently, the field effect transistor 12 can be changed to a normally off-type.

In the above example, the electrode that serves as both the cathode electrode 4 and the source electrode 4b is used, but some electrodes among the anode electrode 3, the cathode electrode 4, the source electrode 4b, the gate electrode 13, and the drain electrode 14 may be freely combined for sharing or such sharing does not have to be done depending on circuit design. Further, in FIG. 16, the recess structure 7 is formed by removing the whole of the carrier inducing layer 22 and a part of the threshold-voltage control layer 21 from the region in the diode 11 corresponding to the peripheral portion 3b of the anode electrode 3 as well as from the position in the field effect transistor 12 where the gate electrode 13 is formed. However, the recess structure 7 may also be structured by removing only the carrier inducing layer 22 because the nitride-based semiconductor device according to the fifth embodiment can be operated as a diode as long as the recess structure 7 is not formed in the barrier layer 2 and the carrier inducing layer 22 is removed. In the example, the central portion 3a of the anode electrode 3 and the cathode electrode 4 in the diode 11 and the source electrode 4b and the drain electrode 14 in the field effect transistor 12 are formed on the carrier inducing layer 22, but they are simply formed in any one of the carrier inducing layer 22, the threshold-voltage control layer 21, and the barrier layer 2.

According to the fifth embodiment, it is possible to form a circuit device, which combines the diode 11 and the field effect transistor 12 with a stabled threshold voltage, on the same substrate by using a wide-gap semiconductor device with high breakdown voltage and low loss. As a result, when the circuit device is used for a circuit such as an inverter, the circuit device with low loss and high breakdown voltage can be provided. Moreover, by forming the diode 11 and the field effect transistor 12 on the same substrate, the number of components can be largely reduced.

Furthermore, the threshold voltage of the field effect transistor used in the nitride-based semiconductor device can be controlled with good yield, and the on-resistance can be decreased. The thickness of the barrier layer 2 is controlled so as to be $16.4 \times (1-1.27 \times (Y-X))/(Y-X)$ [Å] or less, and the total thickness of the barrier layer 2 and the carrier inducing layer 22 is controlled so as to be $16.4 \times (1-1.27 \times (Y-X))/(Y-X)$ [Å] or more. It is thereby possible to realize the normally off-type nitride-based semiconductor device such that there exists no carrier under the gate electrode 13 but the carrier exists between the gate electrode 13 and the source electrode 4b and between the gate electrode 13 and the drain electrode 14.

As explained above, the nitride-based semiconductor device according to the present invention is useful for a power semiconductor device such as a switching element or for a high-frequency power semiconductor device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nitride-based semiconductor device comprising:
   a diode provided on a semiconductor substrate, the diode including
      a first nitride-based semiconductor layer made of non-doped $Al_XGa_{1-X}N$ ($0 \leq X<1$);
      a second nitride-based semiconductor layer formed on the first nitride-based semiconductor layer and made of non-doped or n-type $Al_YGa_{1-Y}N$ ($0<Y \leq 1$, X<Y) having a lattice constant smaller than that of the first nitride-based semiconductor layer;
      a first electrode formed on the second nitride-based semiconductor layer;
      a second electrode formed on the second nitride-based semiconductor layer spaced from the first electrode so as to surround the first electrode; and
      an insulating film that covers the second nitride-based semiconductor layer below a peripheral portion of the first electrode, wherein
   a recess structure portion is formed by removing a part of the second nitride-based semiconductor layer at a position near the peripheral portion of the first electrode on the second nitride-based semiconductor layer, and
   the first electrode is formed so as to cover the second nitride-based semiconductor layer surrounded by the recess structure portion and at least a part of the insulating film formed on the recess structure portion.

2. The device according to claim 1, wherein the second electrode is formed so as to surround the whole periphery of the first electrode.

3. The device according to claim 1, wherein the second electrode is formed so as to surround a part of the periphery of the first electrode, and
   the nitride-based semiconductor device further comprising:

an element separating region formed in another part of the periphery of the first electrode, so as to electrically separate a region where the diode is formed from another element forming region.

4. The device according to claim 1, further comprising:

a field effect transistor placed on the same semiconductor substrate with the diode, wherein the field effect transistor includes a gate electrode formed on the insulating film in a recess structure that is formed on the second nitride-based semiconductor layer at a position different from positions where the first and the second electrodes are formed; and a source electrode and a drain electrode formed at positions across the gate electrode on the second nitride-based semiconductor layer.

5. The device according to claim 1, the thickness of the second nitride-based semiconductor layer is not more than $16.4 \times (1 - 1.27 \times (Y-X))/(Y-X)$ [Å], wherein $Y-X < 1/1.27$.

* * * * *